(12) United States Patent
Chen et al.

(10) Patent No.: US 12,414,293 B2
(45) Date of Patent: Sep. 9, 2025

(54) ANTIFUSE-TYPE ONE TIME PROGRAMMING MEMORY WITH FORKSHEET TRANSISTORS

(71) Applicant: eMemory Technology Inc., Hsin-Chu (TW)

(72) Inventors: Lun-Chun Chen, Hsinchu County (TW); Ping-Lung Ho, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 135 days.

(21) Appl. No.: 18/413,085

(22) Filed: Jan. 16, 2024

(65) Prior Publication Data

US 2024/0324191 A1    Sep. 26, 2024

Related U.S. Application Data

(60) Provisional application No. 63/453,182, filed on Mar. 20, 2023.

(51) Int. Cl.
*H10B 20/00* (2023.01)
*G11C 17/16* (2006.01)
(Continued)

(52) U.S. Cl.
CPC ........... *H10B 20/25* (2023.02); *G11C 17/165* (2013.01); *H10D 30/014* (2025.01); *H10D 30/43* (2025.01);
(Continued)

(58) Field of Classification Search
CPC ... G11C 17/16; G11C 17/165; G11C 13/0002; G11C 13/025; G11C 2213/19;
(Continued)

(56) References Cited

U.S. PATENT DOCUMENTS 8,125,039 B2 * 2/2012 Bertin ................. G11C 17/165
257/420
8,305,790 B2   11/2012 Chung et al.
(Continued)

FOREIGN PATENT DOCUMENTS

CN         115692420 A      2/2023

OTHER PUBLICATIONS

Search report issued by European Patent Office on Aug. 21, 2024.

*Primary Examiner* — Thong Q Le
(74) *Attorney, Agent, or Firm* — WPAT, PC

(57) ABSTRACT

An antifuse-type one time programming memory includes a first memory cell. The first memory cell includes at least one antifuse transistor. The antifuse transistor is forksheet transistor. The antifuse transistor includes a first nanowire, a first gate structure, a first drain/source structure and a second drain/source structure. A first-portion surface of the first nanowire is contacted with the isolation wall. A second-portion surface of the first nanowire is contacted with the first gate structure. The first gate structure includes a first spacer, a second spacer, a first gate dielectric layer and a first gate layer. The first drain/source structure is electrically contacted with a first terminal of the first nanowire. The second drain/source structure is electrically contacted with a second terminal of the first nanowire.

28 Claims, 12 Drawing Sheets

(51) Int. Cl.
    *H10B 20/25*     (2023.01)
    *H10D 30/01*     (2025.01)
    *H10D 30/43*     (2025.01)
    *H10D 30/67*     (2025.01)
    *H10D 62/10*     (2025.01)
    *H10D 62/13*     (2025.01)
    *H10D 64/01*     (2025.01)

(52) U.S. Cl.
    CPC ..... *H10D 30/6735* (2025.01); *H10D 30/6757* (2025.01); *H10D 62/121* (2025.01); *H10D 62/151* (2025.01); *H10D 64/017* (2025.01)

(58) Field of Classification Search
    CPC . G11C 2213/77; G11C 2213/79; G11C 17/18; G11C 16/22; G11C 16/24; G11C 16/26; G11C 16/34; H10B 20/00; H10B 20/25; H10B 43/35; H01L 23/576; H01L 23/573; H01L 25/0753; B82Y 10/00
    USPC .......................................... 365/151, 129, 96
    See application file for complete search history.

(56) References Cited

U.S. PATENT DOCUMENTS

| | | |
|---|---|---|
| 9,620,176 B2 | 4/2017 | Wu et al. |
| 9,634,015 B2 | 4/2017 | Wong et al. |
| 10,586,832 B2 | 3/2020 | Chung |
| 11,735,266 B2 | 8/2023 | Chen et al. |
| 2017/0040067 A1 | 2/2017 | Byun et al. |
| 2023/0064751 A1 | 3/2023 | Chang et al. |

\* cited by examiner

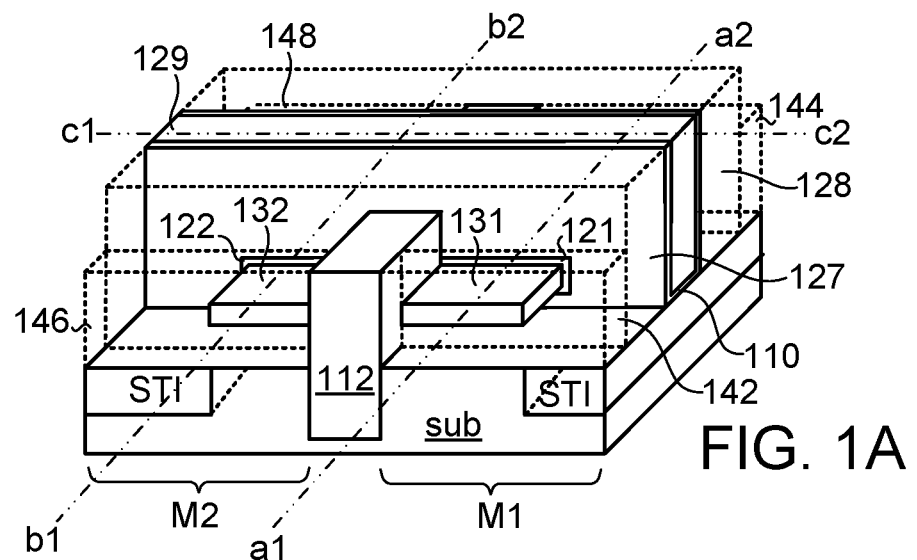
FIG. 1A
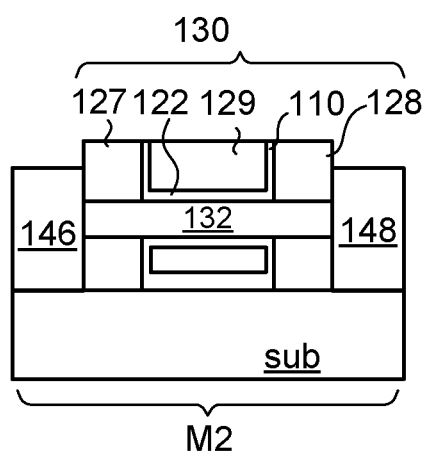
FIG. 1C
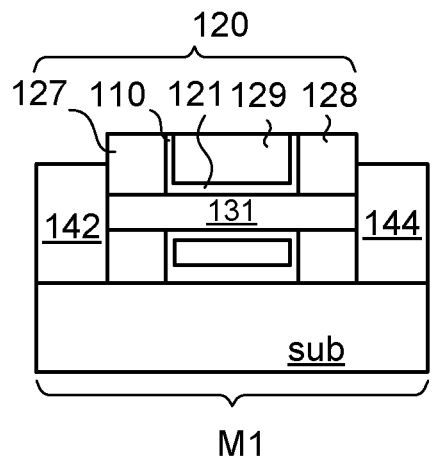
FIG. 1B
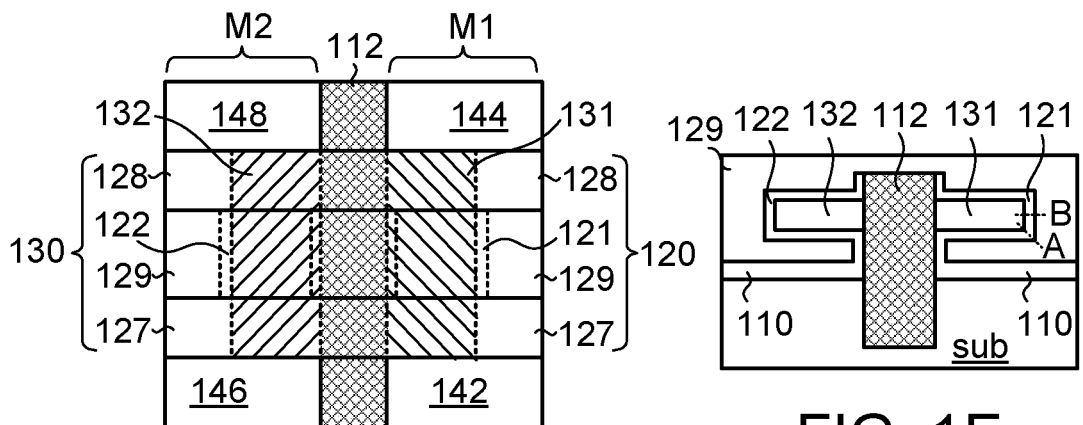
FIG. 1D
FIG. 1E

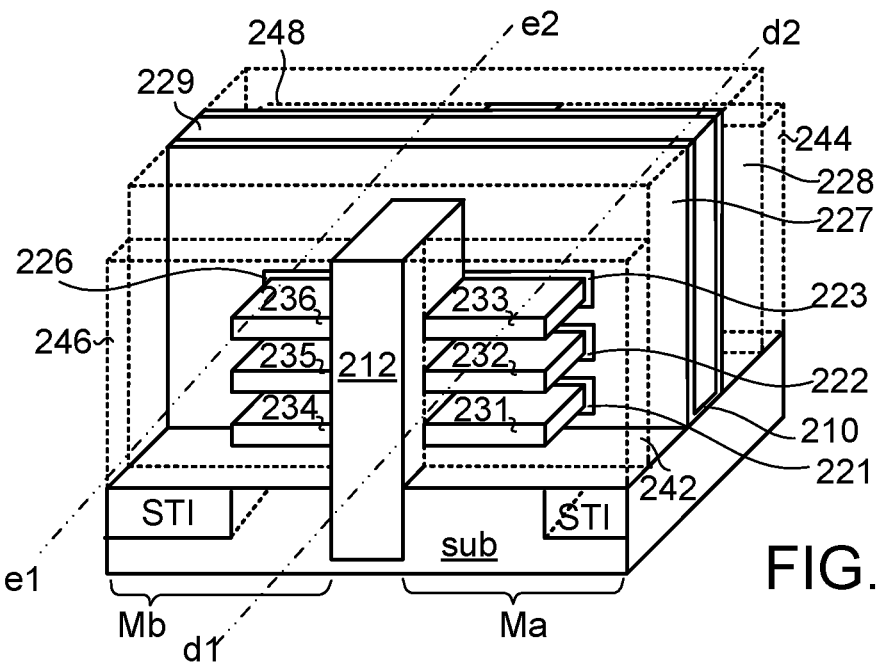
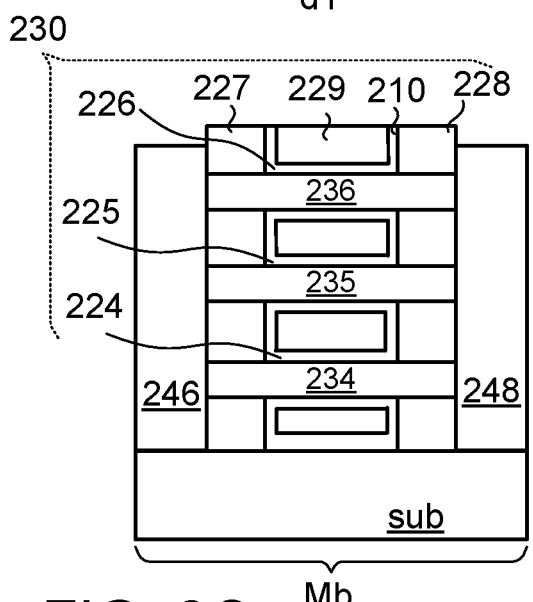
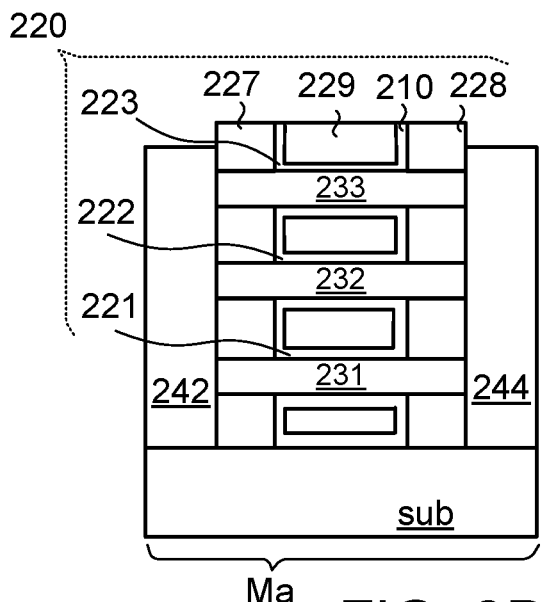
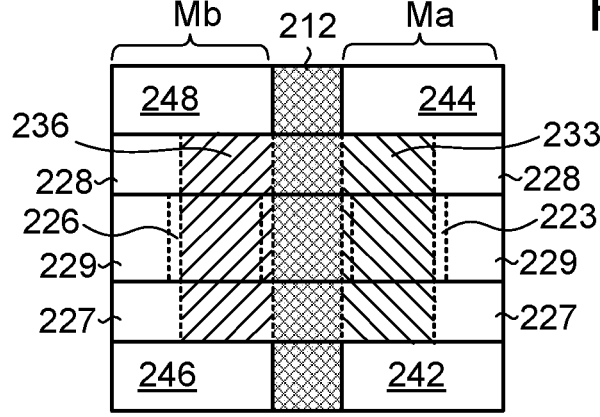
FIG. 2A
FIG. 2B
FIG. 2C
FIG. 2D

ANTIFUSE-TYPE ONE TIME PROGRAMMING MEMORY WITH FORKSHEET TRANSISTORS

This application claims the benefit of U.S. provisional application Ser. No. 63/453,182, filed Mar. 20, 2023, the subject matter of which is incorporated herein by references.

FIELD OF THE INVENTION

The present invention relates to a non-volatile memory, and more particularly to an antifuse-type one time programming memory with forksheet transistors.

BACKGROUND OF THE INVENTION

As is well known, non-volatile memories may be classified into a multi-time programming memory (also referred as a MTP memory), a one time programming memory (also referred as an OTP memory) and a mask read only memory (also referred as a Mask ROM). Generally, the MTP memory can be programmed many times, and the stored data of the MTP memory can be modified many times. In contrast, the OTP memory can be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

For example, before the memory cell of an antifuse-type OTP memory is programmed, the memory cell of the antifuse-type OTP memory is in a high-resistance storage state. After the memory cell of the antifuse-type OTP memory is programmed, the memory cell of the antifuse-type OTP memory is in a low-resistance storage state. After the memory cell of an antifuse-type OTP memory is programmed, the stored data cannot be changed.

With the continuous evolution of semiconductor manufacturing processes, transistors have been gradually developed from the early planar transistors to fin field-effect transistors (Fin-FETs). In a more advanced process, a gate-all-around (GAA) transistor has been produced.

Recently, a so-called forksheet transistor has been proposed. In the forksheet transistor, an N-type transistor and a P-type transistor are integrated into a semiconductor substrate. The N-type transistor and the P-type transistor are separated from each other by a dielectric wall. Consequently, the distance between the N-type transistor and the P-type transistor is shortened, and the area of the integrated circuit is reduced.

SUMMARY OF THE INVENTION

An embodiment of the present invention provides an antifuse-type one time programming memory. The antifuse-type one time programming memory includes a first memory cell. The first memory cell includes: a semiconductor substrate; an isolation wall inserted in the semiconductor substrate; a first nanowire, wherein a first-portion surface of the first nanowire is contacted with a first side of the isolation wall; a first gate structure contacted with a second-portion surface of the first nanowire, and comprising a first spacer, a second spacer, a first gate dielectric layer and a first gate layer, wherein the first gate layer is electrically connected with an antifuse control line, the first gate dielectric layer is contacted with a central region of the first nanowire, the first gate layer is contacted with the first gate dielectric layer, and the first gate layer is located over the semiconductor substrate, wherein a first terminal of the first nanowire is contacted with the first spacer and supported by the first spacer, a second terminal of the first nanowire is contacted with the second spacer and supported by the second spacer, and the first spacer and the second spacer are formed over the semiconductor substrate; a first drain/source structure formed over the semiconductor substrate and electrically contacted with the first terminal of the first nanowire; a second drain/source structure formed over the semiconductor substrate and electrically contacted with the second terminal of the first nanowire, wherein the first nanowire, the first gate structure, the first drain/source structure and the second drain/source structure are collaboratively formed as a first antifuse transistor, and the first antifuse transistor is a forksheet transistor; and, a first select transistor, wherein a first drain/source terminal of the first select transistor is electrically connected with the second drain/source structure of the first antifuse transistor, a gate terminal of the first select transistor is electrically connected with a word line, and a second drain/source terminal of the first select transistor is electrically connected with a first bit line.

Another embodiment of the present invention provides an antifuse-type one time programming memory. The antifuse-type one time programming memory includes a first memory cell. The first memory cell includes: a semiconductor substrate; an isolation wall inserted in the semiconductor substrate; a first nanowire, wherein a first-portion surface of the first nanowire is contacted with a first side of the isolation wall; a first gate structure contacted with a second-portion surface of the first nanowire, and comprising a first spacer, a second spacer, a first gate dielectric layer and a first gate layer, wherein the first gate layer is electrically connected with an antifuse control line, the first gate dielectric layer is contacted with a central region of the first nanowire, the first gate layer is contacted with the first gate dielectric layer, and the first gate layer is located over the semiconductor substrate, wherein a first terminal of the first nanowire is contacted with the first spacer and supported by the first spacer, a second terminal of the first nanowire is contacted with the second spacer and supported by the second spacer, and the first spacer and the second spacer are formed over the semiconductor substrate; a first drain/source structure formed over the semiconductor substrate and electrically contacted with the first terminal of the first nanowire; a second drain/source structure formed over the semiconductor substrate and electrically contacted with the second terminal of the first nanowire, wherein the first nanowire, the first gate structure, the first drain/source structure and the second drain/source structure are collaboratively formed as a first antifuse transistor, and the first antifuse transistor is a forksheet transistor; a first following transistor, wherein a first drain/source terminal of the first following transistor is electrically connected with the second drain/source structure of the first antifuse transistor, and a gate terminal of the first following transistor is electrically connected with a following line; and, a first select transistor, wherein a first drain/source terminal of the first select transistor is electrically connected with a second drain/source terminal of the first following transistor, a gate terminal of the first select transistor is electrically connected with a word line, and a second drain/source terminal of the first select transistor is electrically connected with a first bit line.

Another embodiment of the present invention provides an antifuse-type one time programming memory. The antifuse-type one time programming memory includes a first memory cell. The first memory cell includes: a semiconductor substrate; an isolation wall inserted in the semiconductor substrate; a first nanowire, wherein a first-portion surface of the first nanowire is contacted with a first side of the isolation wall; a first gate structure contacted with a second-portion surface of the first nanowire, and comprising a first spacer, a second spacer, a first gate dielectric layer and a first gate layer, wherein the first gate layer is electrically connected with an antifuse control line, the first gate dielectric layer is contacted with a central region of the first nanowire, the first gate layer is contacted with the first gate dielectric layer, and the first gate layer is located over the semiconductor substrate, wherein a first terminal of the first nanowire is contacted with the first spacer and supported by the first spacer, a second terminal of the first nanowire is contacted with the second spacer and supported by the second spacer, and the first spacer and the second spacer are formed over the semiconductor substrate; a first drain/source structure formed over the semiconductor substrate and electrically contacted with the first terminal of the first nanowire; a second drain/source structure formed over the semiconductor substrate and electrically contacted with the second terminal of the first nanowire, wherein the first nanowire, the first gate structure, the first drain/source structure and the second drain/source structure are collaboratively formed as a first antifuse transistor, and the first antifuse transistor is a forksheet transistor; a first transistor, wherein a first drain/source terminal of the first transistor is electrically connected with the second drain/source structure of the first antifuse transistor; a second transistor, wherein a first drain/source terminal of the second transistor is electrically connected with a second drain/source terminal of the first transistor; and, a third transistor, wherein a first drain/source terminal of the third transistor is electrically connected with a second drain/source terminal of the second transistor, a gate terminal of the third transistor is electrically connected with a word line, and a second drain/source terminal of the second third transistor is electrically connected with a first bit line, wherein a gate terminal of the second transistor is electrically connected with the word line and a gate terminal of the first transistor is electrically connected with a first following line, or the gate terminal of the second transistor is electrically connected with the first following line and the gate terminal of the first transistor is electrically connected with a second following line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A is a schematic perspective view illustrating the structures of two forksheet transistors according to an embodiment of the present invention;

FIG. 1B is a schematic cross-sectional view illustrating the forksheet transistors as shown in FIG. 1A and taken along the line a1-a2;

FIG. 1C is a schematic cross-sectional view illustrating the forksheet transistors as shown in FIG. 1A and taken along the line b1-b2;

FIG. 1D is a schematic top view illustrating the forksheet transistors as shown in FIG. 1A;

FIG. 1E is a schematic cross-sectional view illustrating the forksheet transistors as shown in FIG. 1A and taken along the line c1-c2;

FIG. 2A is a schematic perspective view illustrating the structures of two forksheet transistors according to another embodiment of the present invention;

FIG. 2B is a schematic cross-sectional view illustrating the forksheet transistors as shown in FIG. 2A and taken along the line d1-d2;

FIG. 2C is a schematic cross-sectional view illustrating the forksheet transistors as shown in FIG. 2A and taken along the line e1-e2;

FIG. 2D is a schematic top view illustrating the forksheet transistors as shown in FIG. 2A;

DETAILED DESCRIPTION OF PREFERRED EMBODIMENTS

Figure 3A:
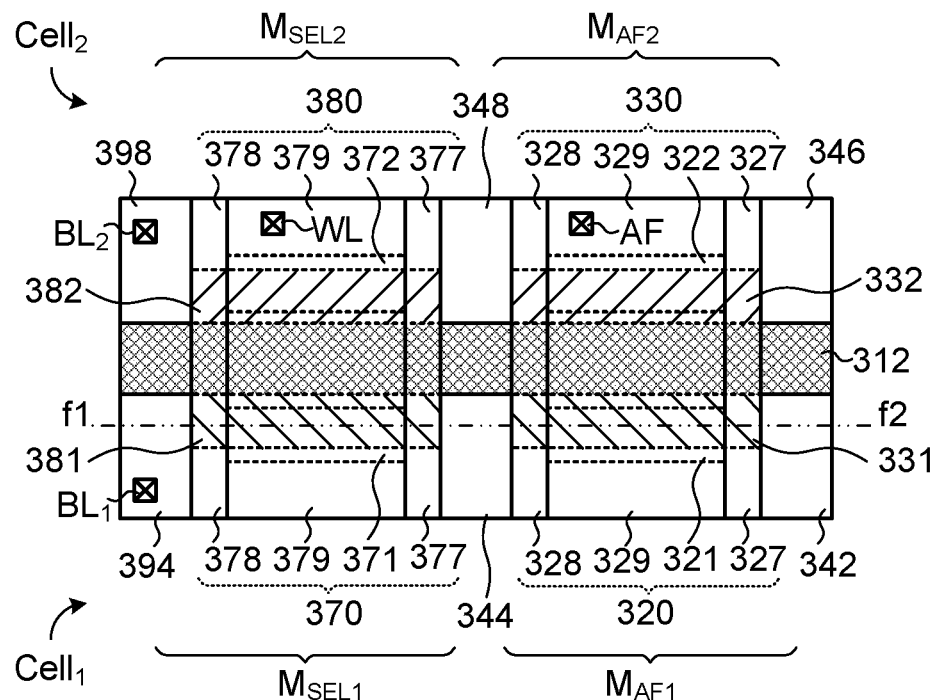
FIG. 3A is a schematic top view illustrating the structure of an OTP memory according to a first embodiment of the present invention.

FIG. 1A is a schematic perspective view illustrating the structures of two forksheet transistors according to an embodiment of the present invention. FIG. 1B is a schematic cross-sectional view illustrating the forksheet transistors as shown in FIG. 1A and taken along the line a1-a2. FIG. 1C is a schematic cross-sectional view illustrating the forksheet transistors as shown in FIG. 1A and taken along the line b1-b2. FIG. 1D is a schematic top view illustrating the forksheet transistors as shown in FIG. 1A. FIG. 1E is a schematic cross-sectional view illustrating the forksheet transistors as shown in FIG. 1A and taken along the line c1-c2.

Please refer to FIGS. 1A to 1E. Firstly, an isolation material STI is formed in a semiconductor substrate sub, and an isolation wall 112 is inserted in the semiconductor substrate sub. Then, two gate structures 120 and 130 are formed on the isolation material STI and the semiconductor substrate sub, and a portion of the isolation wall 112 is covered by the gate structures 120 and 130. Moreover, two nanowires 131 and 132 are respectively penetrated through the gate structures 120 and 130. A first-portion surface of the nanowire 131 is contacted with the isolation wall 112. A second-portion surface of the nanowire 131 is contacted with the gate structure 120. A first-portion surface of the nanowire 132 is contacted with the isolation wall 112. A second-portion surface of the nanowire 132 is contacted with the gate structure 130. For example, the nanowires 131 and 132 are rectangular nanowires or cylindrical nanowires. In case that the nanowires 131 and 132 are rectangular nanowires, a lateral surface of the nanowire 131 is contacted with the isolation wall 112, the other three lateral surfaces of the nanowire 131 is contacted with the gate structure 120, a lateral surface of the nanowire 132 is contacted with the isolation wall 112, and the other three lateral surfaces of the nanowire 132 is contacted with the gate structure 130.

As shown in FIG. 1A and FIG. 1D, two drain/source structures 142 and 144 are formed on the isolation material STI and the semiconductor substrate sub, the two drain/source structures 142 and 144 are located beside a first side of the isolation wall 112, and portions of the two drain/source structures 142 and 144 are contacted with the isolation wall 112. Similarly, two drain/source structures 146 and 148 are formed on the isolation material STI and the semiconductor substrate sub, the two drain/source structures 146 and 148 are located beside a second side of the isolation wall 112, and portions of the two drain/source structures 146 and 148 are contacted with the isolation wall 112. A first terminal of the nanowire 131 is electrically contacted with the drain/source structure 142. A second terminal of the nanowire 131 is electrically contacted with the drain/source structure 144. A first terminal of the nanowire 132 is electrically contacted with the drain/source structure 146. A second terminal of the nanowire 132 is electrically contacted with the drain/source structure 148. The drain/source structure 142 and the drain/source structure 146 are separated from each other by the isolation wall 112. Similarly, the drain/source structure 144 and the drain/source structure 148 are separated from each other by the isolation wall 112.

In a variant example, the first terminal and the second terminal of the nanowire 131 are penetrated through and electrically contacted with the drain/source structures 142 and 144, respectively. Similarly, the first terminal and the second terminal of the nanowire 132 are penetrated through and electrically contacted with the drain/source structures 146 and 148, respectively. Furthermore, the isolation wall 112 may include two isolation materials. For example, a first isolation material STI is formed under the surface of the semiconductor substrate sub, and a second isolation material is formed above the first isolation material.

In an embodiment, the two drain/source structures 142 and 144, the gate structure 120 and the nanowire 131 are collaboratively formed as a forksheet transistor M1, and the two drain/source structures 146 and 148, the gate structure 130 and the nanowire 132 are collaboratively formed as another forksheet transistor M2. In an embodiment, the forksheet transistors M1 and M2 are different types of transistors. In an embodiment, the forksheet transistor M1 is an N-type transistor, and the forksheet transistor M2 is a P-type transistor. In another embodiment, the forksheet transistors M1 and M2 are of the same type. For example, both of the forksheet transistors M1 and M2 are N-type transistors, or both of the forksheet transistors M1 and M2 are P-type transistors.

The gate structure 120 of the forksheet transistor M1 comprises two spacers 127, 128, two gate dielectric layers 110, 121 and a gate layer 129. The gate layer 129 can be made of polysilicon. As shown in FIG. 1A and FIG. 11B, the gate dielectric layer 110 is contacted between a first sidewall of the spacer 127 and a first sidewall of the gate layer 129, and the gate dielectric layer 110 is contacted between a first sidewall of the spacer 128 and a second sidewall of the gate layer 129. Also, the gate dielectric layer 110 is contacted between the surface of the semiconductor substrate sub and a bottom surface of the gate layer 129. Actually, the gate dielectric layer 110 may further include the gate dielectric layer 121. That is to say, the gate structure 120 at least includes two spacers 127, 128, the gate dielectric layer 121 and a gate layer 129, and the gate layer 129 is electrically isolated from the semiconductor substrate sub. Furthermore, the gate dielectric layer 121 is contacted with a central region of the nanowire 131, and the gate dielectric layer 121 is covered by the gate layer 129. A first side region of the nanowire 131 is contacted with the spacer 127 and supported by the spacer 127. A second side region of the nanowire 131 is contacted with the spacer 128 and supported by the spacer 128. That is to say, the first terminal of the nanowire 131 is contacted with the spacer 127 and supported by the spacer 127, and the second terminal of the nanowire 131 is contacted with the spacer 128 and supported by the spacer 128. In addition, the spacers 127 and 128 are formed on the semiconductor substrate sub. The portion of the nanowire 131 that is contacted with the gate structure 120 is a nanowire channel region of the forksheet transistor M1.

The gate structure 130 of the forksheet transistor M2 comprises the two spacers 127, 128, two gate dielectric layers 110, 122 and the gate layer 129. Obviously, the gate layer 129 and the two spacers 127, 128 are shared by the gate structure 120 of the forksheet transistor M1 and the gate structure 130 of the forksheet transistor M2. As shown in FIG. 1A and FIG. 1C, the gate dielectric layer 110 may further include the gate dielectric layer 122. That is to say, the gate structure 130 at least includes two spacers 127, 128, the gate dielectric layer 122 and a gate layer 129. Furthermore, the gate dielectric layer 122 is contacted with a central region of the nanowire 132, and the gate dielectric layer 122 is covered by the gate layer 129. A first side region of the nanowire 132 is contacted with the spacer 127 and supported by the spacer 127. A second side region of the nanowire 132 is contacted with the spacer 128 and supported by the spacer 128. In addition, the spacers 127 and 128 are formed on the semiconductor substrate sub. The portion of the nanowire 132 that is contacted with the gate structure 130 is a nanowire channel region of the forksheet transistor M2.

In an embodiment, portions of the spacers 127, 128 and portions of the gate dielectric layers 121, 122 are contacted with the isolation wall 112. Furthermore, the drain/source structure 142, the drain/source structure 144 and the nanowire 131 of the forksheet transistor M1 have the same dopant type, and the drain/source structure 146, the drain/source structure 148 and the nanowire 132 of the forksheet transistor M2 have the same dopant type. For example, the drain/source structure 142, the drain/source structure 144 and the nanowire 131 of the forksheet transistor M1 are n-type doped regions or p-type doped regions.

In the above embodiment, the forksheet transistor comprises a single nanowire. In some other embodiments, the forksheet transistor comprises plural nanowire. That is, the number of nanowires in the forksheet transistor is not restricted. In the following embodiment, the forksheet transistor with three nanowires will be described.

FIG. 2A is a schematic perspective view illustrating the structures of two forksheet transistors according to another embodiment of the present invention. FIG. 2B is a schematic cross-sectional view illustrating the forksheet transistors as shown in FIG. 2A and taken along the line d1-d2. FIG. 2C is a schematic cross-sectional view illustrating the forksheet transistors as shown in FIG. 2A and taken along the line e1-e2. FIG. 2D is a schematic top view illustrating the forksheet transistors as shown in FIG. 2A.

Please refer to FIGS. 2A to 2D. Firstly, an isolation material STI is formed in a semiconductor substrate sub, and an isolation wall 212 is inserted in the semiconductor substrate sub. Then, two gate structures 220 and 230 are formed on the isolation material STI and the semiconductor substrate sub, and a portion of the isolation wall 212 is covered by the gate structures 220 and 230. Moreover, three nanowires 231, 232 and 233 are penetrated through the gate structure 220, and three nanowires 234, 235 and 236 are penetrated through the gate structure 230. The first-portion surfaces of the nanowires 231, 232 and 233 are contacted with the isolation wall 212. The second-portion surfaces of the nanowires 231, 232 and 233 are contacted with the gate structure 220. The first-portion surfaces of the nanowires 234, 235 and 236 are contacted with the isolation wall 212. The second-portion surfaces of the nanowires 234, 235 and 236 are contacted with the gate structure 230. For example, the nanowires 231, 232, 233, 234, 235 and 236 are rectangular nanowires or cylindrical nanowires.

As shown in FIG. 2A and FIG. 2D, two drain/source structures 242 and 244 are formed on the isolation material STI and the semiconductor substrate sub, the two drain/source structures 242 and 244 are located beside a first side of the isolation wall 212, and portions of the two drain/source structures 242 and 244 are contacted with the isolation wall 212. Similarly, two drain/source structures 246 and 248 are formed on the isolation material STI and the semiconductor substrate sub, the two drain/source structures 246 and 248 are located beside a second side of the isolation wall 212, and portions of the two drain/source structures 246 and 248 are contacted with the isolation wall 212. The first terminals of the nanowires 231, 232 and 233 are electrically contacted with the drain/source structure 242. The second terminals of the nanowires 231, 232 and 233 are electrically contacted with the drain/source structure 244. The first terminals of the nanowires 234, 235 and 236 are electrically contacted with the drain/source structure 246. The second terminals of the nanowires 234, 235 and 236 are electrically contacted with the drain/source structure 248. The drain/source structure 242 and the drain/source structure 246 are separated from each other by the isolation wall 212. Similarly, the drain/source structure 244 and the drain/source structure 248 are separated from each other by the isolation wall 212.

In a variant example, the first terminals and the second terminals of the nanowires 231, 232 and 233 are penetrated through and electrically contacted with the drain/source structures 242 and 244, respectively. Similarly, the first terminals and the second terminals of the nanowires 234, 235 and 236 are penetrated through and electrically contacted with the drain/source structures 246 and 248, respectively. Furthermore, the isolation wall 212 may include two isolation materials. For example, a first isolation material STI is formed under the surface of the semiconductor substrate sub, and a second isolation material is formed above the first isolation material.

In an embodiment, the two drain/source structures 242 and 244, the gate structure 220 and the nanowires 231, 232 and 233 are collaboratively formed as a forksheet transistor Ma, and the two drain/source structures 246 and 248, the gate structure 230 and the nanowires 234, 235 and 236 are collaboratively formed as another forksheet transistor Mb. In an embodiment, the forksheet transistors Ma and Mb are different types of transistors. In an embodiment, the forksheet transistor Ma is an N-type transistor, and the forksheet transistor Mb is a P-type transistor. In another embodiment, the forksheet transistors Ma and Mb are of the same type. For example, both of the forksheet transistors Ma and Mb are N-type transistors, or both of the forksheet transistors Ma and Mb are P-type transistors.

The gate structure 220 of the forksheet transistor Ma comprises two spacers 227, 228, four gate dielectric layers 210, 221, 222 and 223 and a gate layer 229. The gate layer 229 can be made of polysilicon. As shown in FIG. 2A and FIG. 2B, the gate dielectric layer 210 is contacted between a first sidewall of the spacer 227 and a first sidewall of the gate layer 229, and the gate dielectric layer 210 is contacted between a first sidewall of the spacer 228 and a second sidewall of the gate layer 229. Also, the gate dielectric layer 210 is contacted between the surface of the semiconductor substrate sub and a bottom surface of the gate layer 229. Actually, the gate dielectric layer 210 may further include the gate dielectric layers 221, 222, 223. That is to say, the gate structure 220 at least includes two spacers 227, 228, the gate dielectric layers 221, 222, 223 and a gate layer 229, and the gate layer 229 is electrically isolated from the semiconductor substrate sub. Furthermore, the gate dielectric layers 221, 222 and 223 are contacted with the central regions of the nanowires 231, 232 and 233, and the gate dielectric layers 221, 222 and 223 are covered by the gate layer 229. The first side regions of the nanowires 231, 232 and 233 are contacted with the spacer 227 and supported by the spacer 227. The second side regions of the nanowires 231, 232 and 233 are contacted with the spacer 228 and supported by the spacer 228. In addition, the spacers 227 and 228 are formed on the semiconductor substrate sub. The portions of the nanowires 231, 232 and 233 that are contacted with the gate structure 220 are nanowire channel regions of the forksheet transistor Ma.

The gate structure 230 of the forksheet transistor Mb comprises the two spacers 227, 228, four gate dielectric layers 210, 224, 225, 226 and the gate layer 229. Obviously, the gate layer 229 and the two spacers 227, 228 are shared by the gate structure 220 of the forksheet transistor Ma and the gate structure 230 of the forksheet transistor Mb. As shown in FIG. 2A and FIG. 2C, the gate dielectric layer 210 further include the gate dielectric layers 224, 225, 226. That is to say, the gate structure 230 at least includes two spacers 227, 228, the gate dielectric layer 224, 225, 226 and a gate layer 229. Furthermore, the gate dielectric layers 224, 225 and 226 are contacted with the central regions of the nanowires 231, 232 and 233, and the gate dielectric layers 224, 225 and 226 are covered by the gate layer 229. The first side regions of the nanowires 234, 235 and 236 are contacted with the spacer 227 and supported by the spacer 227. The second side regions of the nanowires 234, 235 and 236 are contacted with the spacer 228 and supported by the spacer 228. In addition, the spacers 227 and 228 are formed on the semiconductor substrate sub. The portions of the nanowires 234, 235 and 236 that are contacted with the gate structure 230 are nanowire channel regions of the forksheet transistor Mb.

In an embodiment, portions of the spacers 227, 228 and portions of the gate dielectric layers 221, 222, 223, 224, 225, 226 are contacted with the isolation wall 212. Furthermore, the drain/source structure 242, the drain/source structure 244 and the nanowires 231, 232 and 233 of the forksheet transistor Ma have the same dopant type, and the drain/source structure 246, the drain/source structure 248 and the nanowires 234, 235 and 236 of the forksheet transistor Mb have the same dopant type. For example, the drain/source structure 242, the drain/source structure 244 and the nanowires 231, 232 and 233 of the forksheet transistor Ma are n-type doped regions or p-type doped regions.

Please refer to FIG. 1E again. For example, the nanowire 131 is a rectangular nanowire. A lateral surface of the nanowire 131 is contacted with the isolation wall 112. The other three lateral surfaces of the nanowire 131 is contacted with the gate dielectric layer 121 of the gate structure 120. The thickness of the gate dielectric layer 121 is smaller than about 30 Å. For example, in a case that a voltage difference between the gate layer 129 and the nanowire 131 is 3~6V, the electric field (E) at the positions near the flat surface B of the gate dielectric layer 121 is uniformly distributed. Moreover, as the depth of the gate dielectric layer 121 increases, the electric field (E) at the positions near the corner region A of the gate dielectric layer 121 gradually increases. Moreover, the electric field (E) at the junction between the gate dielectric layer 121 and the nanowire 131 is the largest. When compared with the electric field (E) at the positions near the flat surface B of the gate dielectric layer 121, the electric field (E) at the junction between the gate dielectric layer 121 and the nanowire 131 increases at least 50%. That is, if there is a specified high voltage difference between the gate layer 129 and the nanowire 131, the electric field (E) at the junction between the gate dielectric layer 121 and the nanowire 131 is the largest. As a consequence, the gate dielectric layer 121 is ruptured at the corner region A. Due to the above characteristics, a novel antifuse-type one time programming memory cell with the forksheet transistors can be specially designed.

In accordance with a feature of the present invention, the forksheet transistors shown in FIG. 1B or FIG. 2B may be used as storage elements of a memory cell of an antifuse-type one time programming memory. The storage elements are antifuse transistors. For succinctness, the antifuse-type one time programming memory is also referred to as an OTP memory, and the memory cell of the antifuse-type one time programming memory is also referred as a memory cell.

Figure 3B:
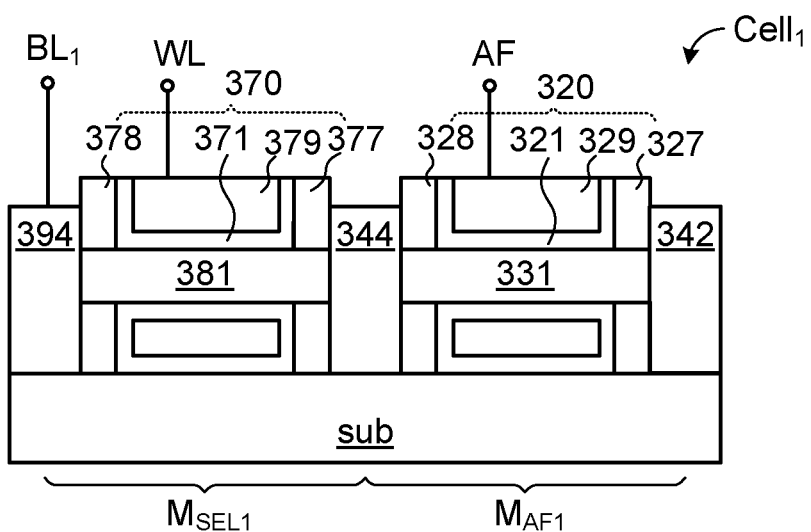
FIG. 3B is a schematic cross-sectional view illustrating the OTP memory as shown in FIG. 3A and taken along the dashed line f1-f2.

FIG. 3A is a schematic top view illustrating the structure of an OTP memory according to a first embodiment of the present invention. FIG. 3B is a schematic cross-sectional view illustrating the OTP memory as shown in FIG. 3A and taken along the dashed line f1-f2.

As shown in FIG. 3A, the OTP memory of the first embodiment comprises two memory cells $Cell_1$ and $Cell_2$, which have the same structures. The two memory cells $Cell_1$ and $Cell_2$ are respectively located beside a first side and a second side of an isolation wall 312. The memory cell $Cell_1$ comprises a select transistor $M_{SEL1}$ and an antifuse transistor $M_{AF1}$. The memory cell $Cell_2$ comprises a select transistor $M_{SEL2}$ and an antifuse transistor $M_{AF2}$. The select transistors $M_{SEL1}$ and $M_{SEL2}$ and the antifuse transistors $M_{AF1}$ and $M_{AF2}$ are forksheet transistors. The select transistors $M_{SEL1}$ and $M_{SEL2}$ and the antifuse transistor $M_{AF1}$ and $M_{AF2}$ are formed over the semiconductor substrate sub. The three-dimensional structures of the select transistors $M_{SEL1}$ and $M_{SEL2}$ and the antifuse transistor $M_{AF1}$ and $M_{AF2}$ are similar to those of the forksheet transistors shown in FIG. 1A, and not redundantly described herein.

The select transistor $M_{SEL1}$ of the memory cell $Cell_1$ comprises a drain/source structure 344, a drain/source structure 394, a gate structure 370 and a nanowire 381. The gate structure 370 of the select transistor $M_{SEL1}$ comprises a gate layer 379, a gate dielectric layer 371 and two spacers 377, 378. The antifuse transistor $M_{AF1}$ of the memory cell $Cell_1$ comprises a drain/source structure 342, the drain/source structure 344, a gate structure 320 and a nanowire 331. The gate structure 320 of the antifuse transistor $M_{AF1}$ comprises a gate layer 329, a gate dielectric layer 321 and two spacers 327, 328.

The select transistor $M_{SEL2}$ of the memory cell $Cell_2$ comprises a drain/source structure 348, a drain/source structure 398, a gate structure 380 and a nanowire 382. The gate structure 380 of the select transistor $M_{SEL2}$ comprises a gate layer 379, a gate dielectric layer 372 and two spacers 377, 378. The antifuse transistor $M_{AF2}$ of the memory cell $Cell_2$ comprises a drain/source structure 346, the drain/source structure 348, a gate structure 330 and a nanowire 332. The gate structure 330 of the antifuse transistor $M_{AF2}$ comprises a gate layer 329, a gate dielectric layer 322 and two spacers 327, 328.

Please refer to FIG. 3A again. In the memory cell $Cell_1$, the drain/source structure 394 of the select transistor $M_{SEL1}$ is connected with a bit line $BL_1$, the gate layer 379 of the select transistor $M_{SEL1}$ is connected with a word line WL, and the gate layer 329 of the antifuse transistor $M_{AF1}$ is connected with an antifuse control line AF. In the memory cell $Cell_2$, the drain/source structure 398 of the select transistor $M_{SEL2}$ is connected with a bit line $BL_2$, the gate layer 379 of the select transistor $M_{SEL2}$ is connected with the word line WL, and the gate layer 329 of the antifuse transistor $M_{AF2}$ is connected with the antifuse control line AF. In this embodiment, the memory cell $Cell_1$ and the memory cell $Cell_2$ are respectively connected with different bit lines $BL_1$ and $BL_2$. In addition, the word line WL and the antifuse control line AF are shared by the memory cell $Cell_1$ and the memory cell $Cell_2$.

Since the structures of the memory cells $Cell_1$ and $Cell_2$ are identical, only the structure of the memory cell $Cell_1$ will be described as follows.

As shown in FIG. 3B, the select transistor $M_{SEL1}$ of the memory cell $Cell_1$ comprises the drain/source structure 344, the drain/source structure 394, the gate structure 370 and the nanowire 381. The gate structure 370 is located over the semiconductor substrate sub. The gate structure 370 comprises the gate layer 379, the gate dielectric layer 371 and the two spacers 377, 378. A first-portion surface of the nanowire 381 is contacted with the isolation wall 312. A second-portion surface of the nanowire 381 is contacted with the gate structure 370. A central region of the nanowire 381 is contacted with the gate dielectric layer 371. The gate dielectric layer 371 is covered by the gate layer 379. The gate layer 379 is located over the semiconductor substrate sub. A first side region of the nanowire 381 is contacted with the spacer 377 and supported by the spacer 377. A second side region of the nanowire 381 is contacted with the spacer 378 and supported by the spacer 378. In addition, the spacers 377 and 378 are formed on the semiconductor substrate sub. The portion of the nanowire 381 that is contacted with the gate structure 370 is a nanowire channel region of the select transistor $M_{SEL1}$. The drain/source structures 344 and 394 are formed over the semiconductor substrate sub and respectively located beside two sides of the gate structure 370. The drain/source structure 344 is electrically contacted with the first terminal of the nanowire 381. The drain/source structure 394 is electrically contacted with the second terminal of the nanowire 381.

The antifuse transistor $M_{AF1}$ of the memory cell Cell$_1$ comprises the drain/source structure 342, the drain/source structure 344, the gate structure 320 and the nanowire 331. The gate structure 320 is located over the semiconductor substrate sub. The gate structure 320 comprises the gate layer 329, the gate dielectric layer 321 and the two spacers 327, 328. A first-portion surface of the nanowire 331 is contacted with the isolation wall 312. A second-portion surface of the nanowire 331 is contacted with the gate structure 320. A central region of the nanowire 331 is contacted with the gate dielectric layer 321. The gate dielectric layer 321 is covered by the gate layer 329. The gate layer 329 is located over the semiconductor substrate sub. A first side region of the nanowire 331 is contacted with the spacer 327 and supported by the spacer 327. A second side region of the nanowire 331 is contacted with the spacer 328 and supported by the spacer 328. In addition, the spacers 327 and 328 are formed on the semiconductor substrate sub. The portion of the nanowire 331 that is contacted with the gate structure 320 is a nanowire channel region of the antifuse transistor $M_{AF1}$. The drain/source structures 342 and 344 are formed over the semiconductor substrate sub and respectively located beside two sides of the gate structure 320. The drain/source structure 342 is electrically contacted with the first terminal of the nanowire 331. The drain/source structure 344 is electrically contacted with the second terminal of the nanowire 331.

In this embodiment, the drain/source structure 344 is shared by the select transistor $M_{SEL1}$ and the antifuse transistor $M_{AF1}$ of the memory cell Cell$_1$. In an embodiment, the drain/source structures 394, 344 and 342 and the nanowires 381 and 331 of the memory cell Cell$_1$ have the same dopant type. For example, the drain/source structures 394, 344 and 342 and the nanowires 381 and 331 are n-type doped regions or p-type doped regions. In addition, the nanowires 381 and 331 of the memory cell Cell$_1$ are rectangular nanowires or cylindrical nanowires.

Figure 4A:
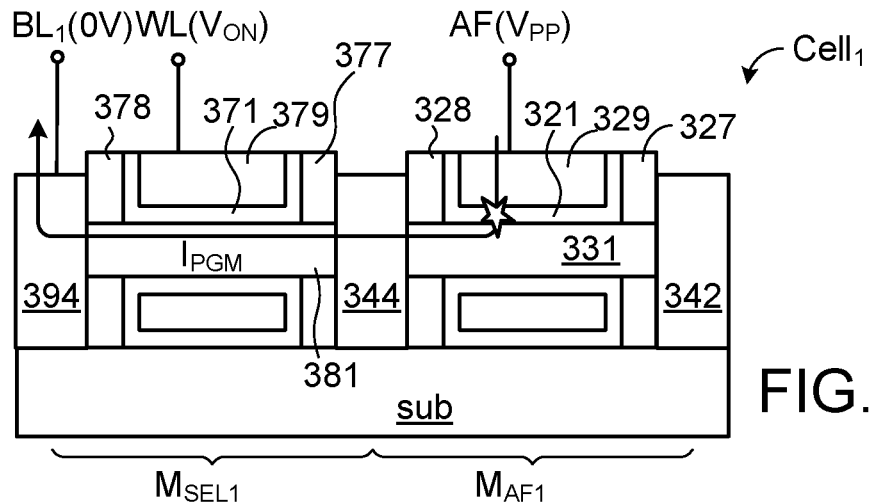
FIG. 4A schematically illustrates associated bias voltages for performing a program action on the OTP memory according to the first embodiment of the present invention.
Figure 4B:
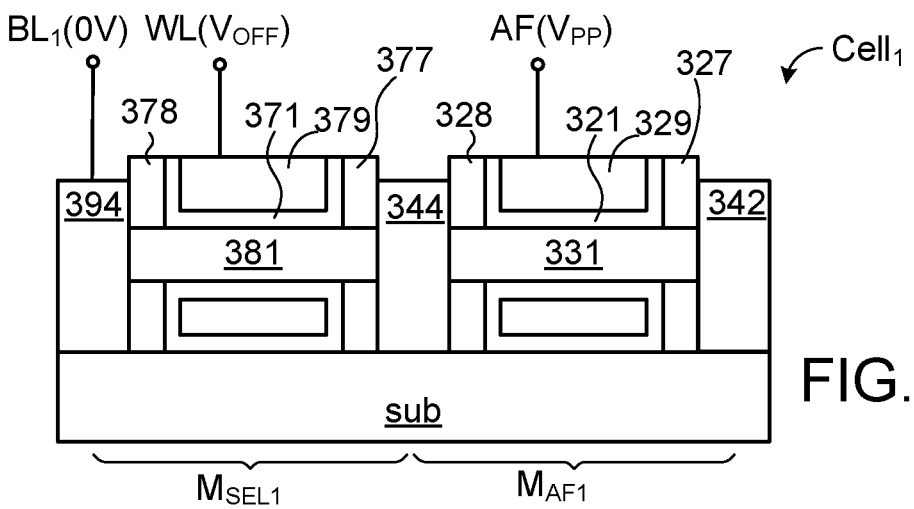
FIG. 4B schematically illustrates associated bias voltages for performing a program inhibition action on the OTP memory according to the first embodiment of the present invention.
Figure 4C:
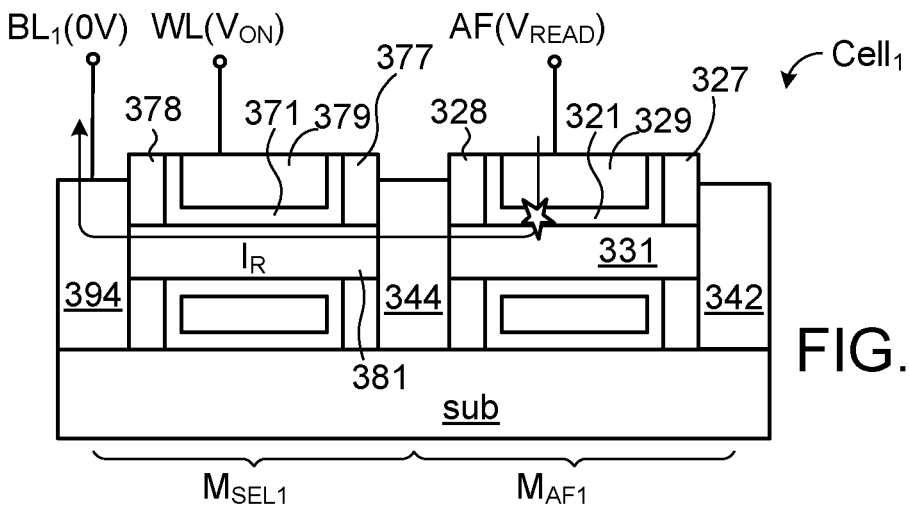
FIG. 4C schematically illustrates associated bias voltages for performing a read action on the OTP memory according to the first embodiment of the present invention.

FIG. 4A schematically illustrates associated bias voltages for performing a program action on the OTP memory according to the first embodiment of the present invention. FIG. 4B schematically illustrates associated bias voltages for performing a program inhibition action on the OTP memory according to the first embodiment of the present invention. FIG. 4C schematically illustrates associated bias voltages for performing a read action on the OTP memory according to the first embodiment of the present invention.

Please refer to FIG. 4A. When the program action is performed on the memory cell Cell$_1$ of the OTP memory, the antifuse control line AF receives a program voltage $V_{PP}$, the bit line BL$_1$ receives a ground voltage (0V), and the word line WL receives an on voltage $V_{ON}$. For example, the program voltage $V_{PP}$ is in the range between 3V and 6V, and the on voltage $V_{ON}$ is in the range between 0.4V and 3V.

When the program action is performed, the select transistor $M_{SEL1}$ of the memory cell Cell$_1$ is turned on. Consequently, the ground voltage (0V) of the bit line BL$_1$ is transmitted to the drain/source structure 344 of the antifuse transistor $M_{AF1}$ through the nanowire 381 of the select transistor $M_{SEL1}$. When the antifuse control line AF receives the program voltage $V_{PP}$, the voltage stress between the nanowire 331 and the gate layer 329 of the antifuse transistor $M_{AF1}$ is equal to the program voltage $V_{PP}$. Under this circumstance, the gate dielectric layer 321 of the antifuse transistor $M_{AF1}$ is ruptured. Consequently, the memory cell Cell$_1$ generates a program current $I_{PGM}$. The program current $I_{PGM}$ flows from the antifuse control line AF to the bit line BL$_1$. Consequently, the region between the gate layer 329 and the drain/source structure 344 of the antifuse transistor $M_{AF1}$ has a low resistance value. That is, the memory cell Cell$_1$ is programmed to a low-resistance storage state.

In the OTP memory of FIG. 3A, the word line WL and the antifuse control line AF are shared by the memory cell Cell$_1$ and the memory cell Cell$_2$. When the program action is performed on the memory cell Cell$_1$, the bit line BL$_2$ of the memory cell Cell$_2$ is in a floating state. Consequently, the program action is not performed on the memory cell Cell$_2$. Alternatively, the bit line BL$_2$ of the memory cell Cell$_2$ receives the on voltage $V_{ON}$, and thus the program action is not performed on the memory cell Cell$_2$.

Please refer to FIG. 4B. When the program inhibition action is performed on the memory cell Cell$_1$, the antifuse control line AF receives the program voltage $V_{PP}$, the bit line BL$_1$ receives the ground voltage (0V), and the word line WL receives an off voltage $V_{OFF}$. Thus, the select transistor $M_{SEL1}$ of the memory cell Cell$_1$ is turned off. Consequently, the ground voltage (0V) of the bit line BL$_1$ cannot be transmitted to the drain/source structure 344 of the antifuse transistor $M_{AF1}$. When the antifuse control line AF receives the program voltage $V_{PP}$, the voltage stress between the gate layer 329 and the nanowire 331 of the antifuse transistor $M_{AF1}$ is very low. Under this circumstance, the program current $I_{PGM}$ is not generated, and the gate dielectric layer 321 of the antifuse transistor $M_{AF1}$ is not ruptured. Consequently, the region between the gate layer 329 and the drain/source structure 344 of the antifuse transistor $M_{AF1}$ is maintained in a high resistance value. That is, the memory cell Cell$_1$ is maintained in a high-resistance storage state. Similarly, since the word line WL is shared by the memory cell Cell$_1$ and the memory cell Cell$_2$, the storage state of the memory cell Cell$_2$ is also not changed when the word line WL receives the off voltage $V_{OFF}$.

In another embodiment, when the program inhibition action is performed on the memory cell Cell$_1$, the antifuse control line AF is in a floating state. Consequently, regardless of whether the select transistor $M_{SEL1}$ is turned on or turned off, the gate dielectric layer 321 of the antifuse transistor $M_{AF1}$ is not ruptured. That is, the memory cell Cell$_1$ is maintained in the high-resistance storage state. Alternatively, when the program inhibition action is performed on the memory cell Cell$_1$, the bit line BL$_1$ and the word line WL receive the program voltage $V_{PP}$. Consequently, the memory cell Cell$_1$ is also maintained in the high-resistance storage state.

Please refer to FIG. 4C. When the read action is performed, the antifuse control line AF receives a read voltage VREAD, the bit line $BL_1$ receives the ground voltage (0V), and the word line WL receives the on voltage $V_{ON}$. For example, the read voltage VREAD is in the range between 0.4V and 1.6V. When the read action is performed, the select transistor $M_{SEL1}$ of the memory cell $Cell_1$ is turned on. Since the gate dielectric layer 321 of the antifuse transistor $M_{AF1}$ is ruptured, the region between the gate layer 329 and the drain/source structure 344 of the antifuse transistor $M_{AF1}$ has a low resistance value. Under this circumstance, a higher read current $I_R$ is generated between the antifuse control line AF and the bit line $BL_1$.

Whereas, if the gate dielectric layer 321 of the antifuse transistor $M_{AF1}$ in the memory cell $Cell_1$ is not ruptured, the magnitude of the current $I_R$ generated between the antifuse control line AF and the bit line $BL_1$ is very low (e.g., nearly zero).

In other words, the storage state of the memory cell $Cell_1$ can be determined as the high-resistance storage state or the low-resistance storage state according to the magnitude of the generated read current $I_R$ during the read action. In an embodiment, a reference current and a current comparator are provided. If the read current $I_R$ is higher than the reference current, the current comparator (not shown) judges that the memory cell $Cell_1$ is in the low-resistance storage state. Whereas, if the read current $I_R$ is lower than the reference current, the current comparator judges that the memory cell $Cell_1$ is in the high-resistance storage state.

It is noted that the structure of the memory cell in the OTP memory of the first embodiment may be properly modified. In a variant example, the thickness of the gate dielectric layer 371 of the gate structure 370 in the select transistor $M_{SEL1}$ is larger than the thickness of the gate dielectric layer 321 of the gate structure 320 in the antifuse transistor $M_{AF1}$. Consequently, the leakage current generated by the memory cell $Cell_1$ is reduced, and the reliability of the memory cell $Cell_1$ is enhanced.

In another variant example, the cross section areas of the nanowires in the select transistor $M_{SEL1}$ and the antifuse transistor $M_{AF1}$ are modified. For example, the cross section area of the nanowire 381 in the select transistor $M_{SEL1}$ is larger than the cross section area of the nanowire 331 in the antifuse transistor $M_{AF1}$. In this way, a lower program voltage $V_{PP}$ is sufficient to complete the program action.

In the memory cell $Cell_1$ of the first embodiment, each of the select transistor $M_{SEL1}$ and the antifuse transistor $M_{AF1}$ has a single nanowire. It is noted that numerous modifications and alterations may be made while retaining the teachings of the invention. For example, in some other embodiments, each of the select transistor $M_{SEL1}$ and the antifuse transistor $M_{AF1}$ has two or more than two nanowires. In the following two embodiments (i.e., the second and third embodiments), the forksheet transistor of the memory cell has three nanowires.

Figure 5A:
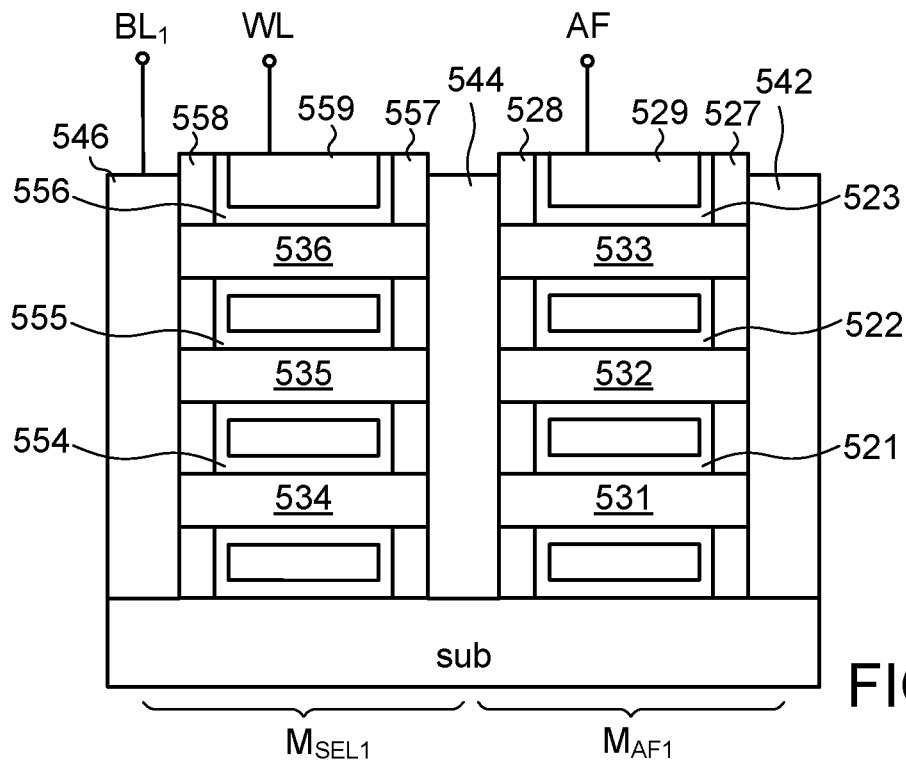
FIG. 5A is a schematic cross-sectional view illustrating the structure of an OTP memory according to a second embodiment of the present invention.

FIG. 5A is a schematic cross-sectional view illustrating the structure of an OTP memory according to a second embodiment of the present invention. The top view of the OTP memory of the second embodiment is similar to that of FIG. 3A, and not redundantly described herein.

The OTP memory of the second embodiment comprises two memory cells, which have the same structures. The two memory cells are respectively located beside a first side and a second side of an isolation wall (not shown). For succinctness, only the structure of one memory cell will be described as follows. In the second embodiment, the memory cell of the OTP memory comprises a select transistor $M_{SEL1}$ and an antifuse transistor $M_{AF1}$. The select transistor $M_{SEL1}$ and the antifuse transistor $M_{AF1}$ are forksheet transistors. The select transistor $M_{SEL1}$ and the antifuse transistor $M_{AF1}$ are formed over the semiconductor substrate sub. The three-dimensional structures of the select transistor $M_{SEL1}$ and the antifuse transistor $M_{AF1}$ are similar to those of the forksheet transistors shown in FIG. 2A, and not redundantly described herein.

The select transistor $M_{SEL1}$ comprises a drain/source structure 544, a drain/source structure 546, the gate structure and three nanowires 534, 535, 536. The gate structure is located over the semiconductor substrate sub. The gate structure comprises a gate layer 559, three gate dielectric layers 554, 555, 556 and the two spacers 557, 558. The first-portion surfaces of the three nanowires 534, 535 and 536 are contacted with the isolation wall. The second-portion surfaces of the three nanowires 534, 535 and 536 are contacted with the gate structure. A central region of the nanowire 534 is contacted with the gate dielectric layer 554. A central region of the nanowire 535 is contacted with the gate dielectric layer 555. A central region of the nanowire 536 is contacted with the gate dielectric layer 556. The gate dielectric layers 554, 555 and 556 are covered by the gate layer 559. The gate layer 559 is located over the semiconductor substrate sub. The first side regions of the three nanowires 534, 535 and 536 are contacted with the spacer 557 and supported by the spacer 557. The second side regions of the three nanowires 534, 535 and 536 are contacted with the spacer 558 and supported by the spacer 558. In addition, the spacers 557 and 558 are formed on the semiconductor substrate sub. The portions of the three nanowires 534, 535 and 536 that are contacted with the gate structure are collaboratively served as a nanowire channel region of the select transistor $M_{SEL1}$. The drain/source structures 544 and 546 are formed over the semiconductor substrate sub and respectively located beside two sides of the gate structure. The drain/source structure 544 is electrically contacted with the first terminals of the nanowires 534, 535 and 536. The drain/source structure 546 is electrically contacted with the second terminals of the nanowires 534, 535 and 536.

The antifuse transistor $M_{AF1}$ of the memory cell comprises a drain/source structure 542, a drain/source structure 544, a gate structure and three nanowires 531, 532 and 533. The gate structure is located over the semiconductor substrate sub. The gate structure comprises a gate layer 529, three gate dielectric layer 521, 522, 523 and two spacers 527, 528. The first-portion surfaces of the nanowires 531, 532 and 533 are contacted with the isolation wall. The second-portion surfaces of the nanowires 531, 532 and 533 are contacted with the gate structure. A central region of the nanowire 531 is contacted with the gate dielectric layer 521. A central region of the nanowire 532 is contacted with the gate dielectric layer 522. A central region of the nanowire 533 is contacted with the gate dielectric layer 523. The gate dielectric layers 521, 522 and 523 are covered by the gate layer 529. The gate layer 529 is located over the semiconductor substrate sub. The first side regions of the nanowires 531, 532 and 533 are contacted with the spacer 527 and supported by the spacer 527. The second side regions of the nanowires 531, 532 and 533 are contacted with the spacer 528 and supported by the spacer 528. In addition, the spacers 527 and 528 are formed on the semiconductor substrate sub. The portion of the nanowires 531, 532 and 533 that are contacted with the gate structure are collaboratively served as a nanowire channel region of the antifuse transistor $M_{AF1}$. The drain/source structures 542 and 544 are formed over the semiconductor substrate sub and respectively located beside two sides of the gate structure. The drain/source structure 542 is electrically contacted with the first terminals of the nanowires 531, 532 and 533. The drain/source structure 544 is electrically contacted with the second terminals of the nanowires 531, 532 and 533.

In this embodiment, the drain/source structure 544 is shared by the select transistor $M_{SEL1}$ and the antifuse transistor $M_{AF1}$. In an embodiment, the drain/source structures 542, 544 and 546 and the nanowires 531, 532, 533, 534, 535 and 536 of the memory cell have the same dopant type. For example, the drain/source structures 542, 544 and 546 and the nanowires 531, 532, 533, 534, 535 and 536 are n-type doped regions or p-type doped regions.

In the memory cell of the OTP memory of the second embodiment, the drain/source structure 546 of the select transistor $M_{SEL1}$ is connected with a bit line $BL_1$, the gate layer 559 of the select transistor $M_{SEL1}$ is connected with a word line WL, and the gate layer 529 of the antifuse transistor $M_{AF1}$ is connected with an antifuse control line AF. In addition, the nanowires 531, 532, 533, 534, 535 and 536 of the memory cell are rectangular nanowires or cylindrical nanowires.

The methods of performing the program action, the program inhibition action and the read action on the OTP memory of the second embodiment are similar to those of the first embodiment. For succinctness, only the program action performed on the OTP memory of the second embodiment will be described as follows.

Figure 5B:
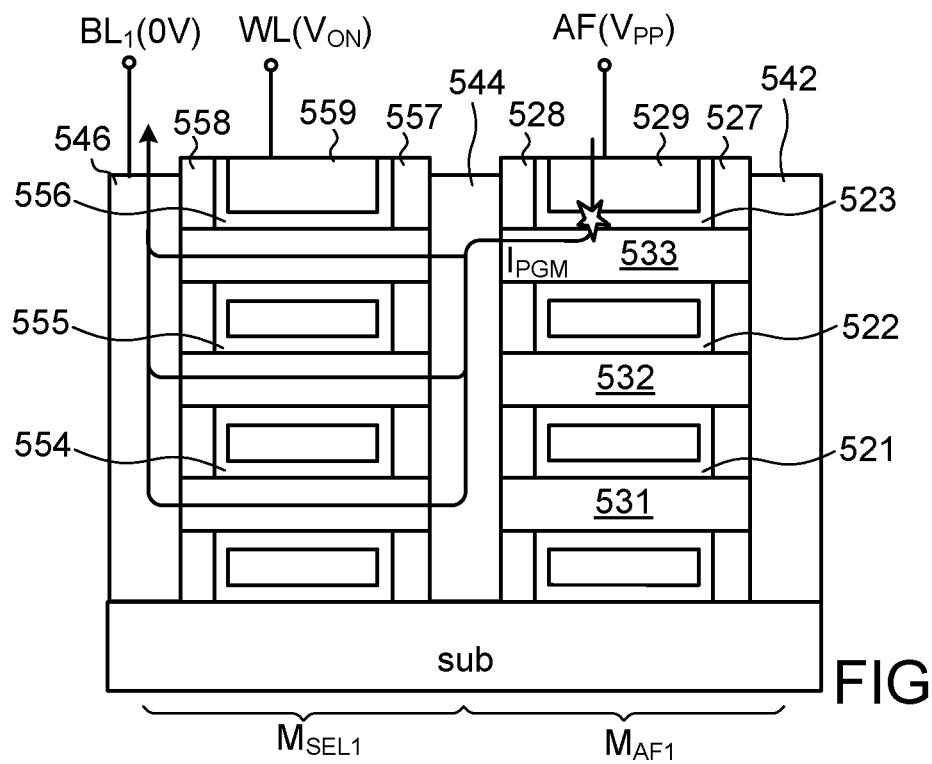
FIG. 5B schematically illustrates associated bias voltages for performing a program action on the OTP memory according to the second embodiment of the present invention.

FIG. 5B schematically illustrates associated bias voltages for performing a program action on the OTP memory according to the second embodiment of the present invention. Please refer to FIG. 5B. When the program action is performed, the antifuse control line AF receives a program voltage $V_{PP}$, the bit line $BL_1$ receives a ground voltage (0V), and the word line WL receives an on voltage $V_{ON}$. For example, the program voltage $V_{PP}$ is in the range between 3V and 6V, and the on voltage $V_{ON}$ is in the range between 0.4V and 3V.

When the program action is performed, the select transistor $M_{SEL1}$ of the memory cell is turned on. Consequently, the ground voltage (0V) of the bit line $BL_1$ is transmitted to the drain/source structure 544 of the antifuse transistor $M_{AF1}$ through the nanowires 534, 535 and 536 of the select transistor $M_{SEL1}$. When the antifuse control line AF receives the program voltage $V_{PP}$, the voltage stress between the nanowires 531, 532 and 533 and the gate layer 529 of the antifuse transistor $M_{AF1}$ is equal to the program voltage $V_{PP}$. Under this circumstance, one of the gate dielectric layers 521, 522 and 523 of the antifuse transistor $M_{AF1}$ is ruptured. For example, the gate dielectric layer 523 is ruptured. Consequently, the memory cell generates a program current $I_{PGM}$. The program current $I_{PGM}$ flows from the antifuse control line AF to the bit line $BL_1$. Consequently, the region between the gate layer 529 and the drain/source structure 544 of the antifuse transistor $M_{AF1}$ has a low resistance value. That is, the memory cell is programmed to a low-resistance storage state.

Similarly, it is noted that the structure of the memory cell in the OTP memory of the second embodiment may be properly modified. In a variant example, the thicknesses of the gate dielectric layers 554, 555 and 556 of the gate structure in the select transistor $M_{SEL1}$ is larger than the thicknesses of the gate dielectric layers 521, 522 and 523 of the gate structure in the antifuse transistor $M_{AF1}$. Consequently, the leakage current generated by the memory cell is reduced, and the reliability of the memory cell is enhanced.

In another variant example, the cross section areas of the nanowires in the select transistor $M_{SEL1}$ and the antifuse transistor $M_{AF1}$ are modified. For example, the cross section areas of the nanowires 534, 535 and 536 in the select transistor $M_{SEL1}$ are larger than the cross section areas of the nanowires 531, 532 and 533 in the antifuse transistor $M_{AF1}$. In this way, a lower program voltage $V_{PP}$ is sufficient to complete the program action.

In the memory cell of the second embodiment, each of the select transistor $M_{SEL1}$ and the antifuse transistor $M_{AF1}$ has three nanowires. It is noted that numerous modifications and alterations may be made while retaining the teachings of the invention. For example, in some other embodiments, the select transistor $M_{SEL1}$ has X nanowires, and the antifuse transistor $M_{AF1}$ has Y nanowires, wherein X and Y are positive integers. It is noted that X and Y may be identical or different. The select transistor $M_{SEL1}$ and the antifuse transistor $M_{AF1}$ are integrated as a memory cell of the OTP memory.

Figure 6:
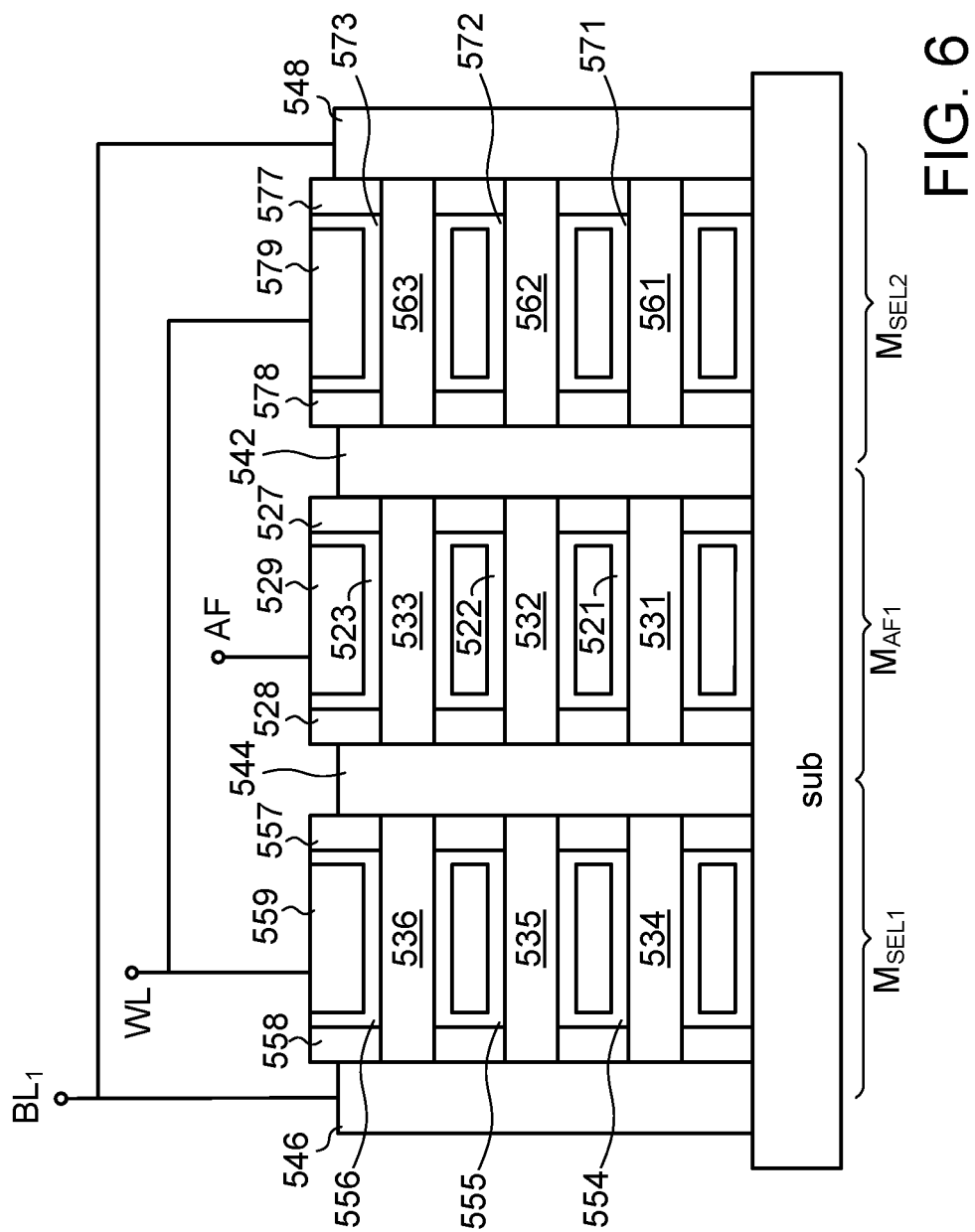
FIG. 6 is a schematic cross-sectional view illustrating the structure of an OTP memory according to a third embodiment of the present invention.

FIG. 6 is a schematic cross-sectional view illustrating the structure of an OTP memory according to a third embodiment of the present invention. The OTP memory of the third embodiment comprises two memory cells, which have the same structures. The two memory cells are respectively located beside a first side and a second side of an isolation wall (not shown).

In comparison with the memory cell of the OTP memory of the second embodiment, the memory cell of the OTP memory of the third embodiment further comprises an additional forksheet transistor. For succinctness, only the additional forksheet transistor will be described as follows. The other structures of the memory cell of the third embodiment are similar to those of the second embodiment, and not redundantly described herein.

As shown in FIG. 6, the memory cell of the OTP memory of the third embodiment comprises a select transistor $M_{SEL1}$, an antifuse transistor $M_{AF1}$ and a select transistor $M_{SEL2}$. The select transistor $M_{SEL1}$, the antifuse transistor $M_{AF1}$ and the select transistor $M_{SEL2}$ are formed over the semiconductor substrate sub. In comparison with the memory cell of the OTP memory of the second embodiment, the memory cell of the OTP memory of the third embodiment further comprises a select transistor $M_{SEL2}$.

The select transistor $M_{SEL2}$ comprises a drain/source structure 548, a drain/source structure 542, a gate structure and three nanowires 561, 562 and 563. The gate structure is located over the semiconductor substrate sub. The gate structure comprises a gate layer 579, three gate dielectric layers 571, 572, 573 and two spacers 577, 578. The first-portion surfaces of the nanowires 561, 562 and 563 are contacted with the isolation wall. The second-portion surfaces of the nanowires 561, 562 and 563 are contacted with the gate structure. A central region of the nanowire 561 is contacted with the gate dielectric layer 571. A central region of the nanowire 562 is contacted with the gate dielectric layer 572. A central region of the nanowire 563 is contacted with the gate dielectric layer 573. The gate dielectric layers 571, 572 and 573 are covered by the gate layer 579. The gate layer 579 is located over the semiconductor substrate sub. The first side regions of the nanowires 561, 562 and 563 are contacted with the spacer 577 and supported by the spacer 577. The second side regions of the nanowires 561, 562 and 563 are contacted with the spacer 578 and supported by the spacer 578. In addition, the spacers 577 and 578 are formed on the semiconductor substrate sub. The portions of the nanowires 561, 562 and 563 that are contacted with the gate structure are collaboratively served as a nanowire channel region of the select transistor $M_{SEL2}$. The drain/source structures 548 and 542 are formed over the semiconductor substrate sub and respectively located beside two sides of the gate structure. The drain/source structure 542 is electrically contacted with the first terminals of the nanowires 561, 562 and 563. The drain/source structure 542 is electrically contacted with the second terminals of the nanowires 561, 562 and 563.

In this embodiment, the drain/source structure 542 is shared by the select transistor $M_{SEL2}$ and the antifuse transistor $M_{AF1}$. In an embodiment, the drain/source structures 542, 544, 546 and 548 and the nanowires 531, 532, 533, 534, 535, 536, 561, 562 and 563 of the memory cell have the same dopant type. For example, the drain/source structures 542, 544, 546 and 548 and the nanowires 531, 532, 533, 534, 535, 536, 561, 562 and 563 are n-type doped regions or p-type doped regions.

In the memory cell, the drain/source structures 546 and 548 of the select transistor $M_{SEL1}$ are connected with a bit line $BL_1$, the gate layer 559 of the select transistor $M_{SEL1}$ and the gate layer 579 of the select transistor $M_{SEL2}$ connected with a word line WL, and the gate layer 529 of the antifuse transistor $M_{AF1}$ is connected with an antifuse control line AF. The methods of performing the program action, the program inhibition action and the read action on the OTP memory of the third embodiment are similar to those of the second embodiment, and not redundantly described herein.

In the memory cell of the OTP memory of the third embodiment, each of the select transistor $M_{SEL1}$, the antifuse transistor $M_{AF1}$ and the select transistor $M_{SEL2}$ has three nanowires. It is noted that numerous modifications and alterations may be made while retaining the teachings of the invention. For example, in some other embodiments, the select transistor $M_{SEL1}$ has X nanowires, the antifuse transistor $M_{AF1}$ has Y nanowires, and the select transistor $M_{SEL2}$ has Z nanowires wherein X, Y and Z are positive integers. It is noted that X, Y and Z may be identical or different. The select transistor $M_{SEL1}$, the antifuse transistor $M_{AF1}$ and the select transistor $M_{SEL2}$ are integrated as a memory cell of the OTP memory.

Figure 7A:
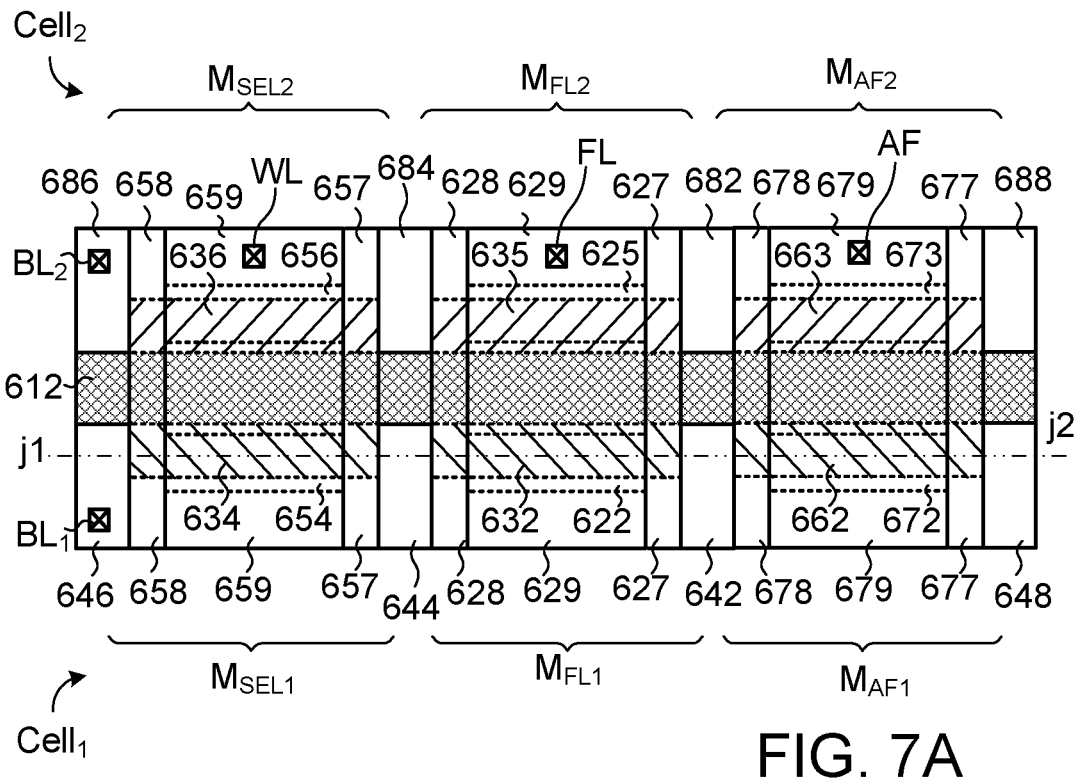
FIG. 7A is a schematic top view illustrating the structure of an OTP memory according to a fourth embodiment of the present invention.
Figure 7B:
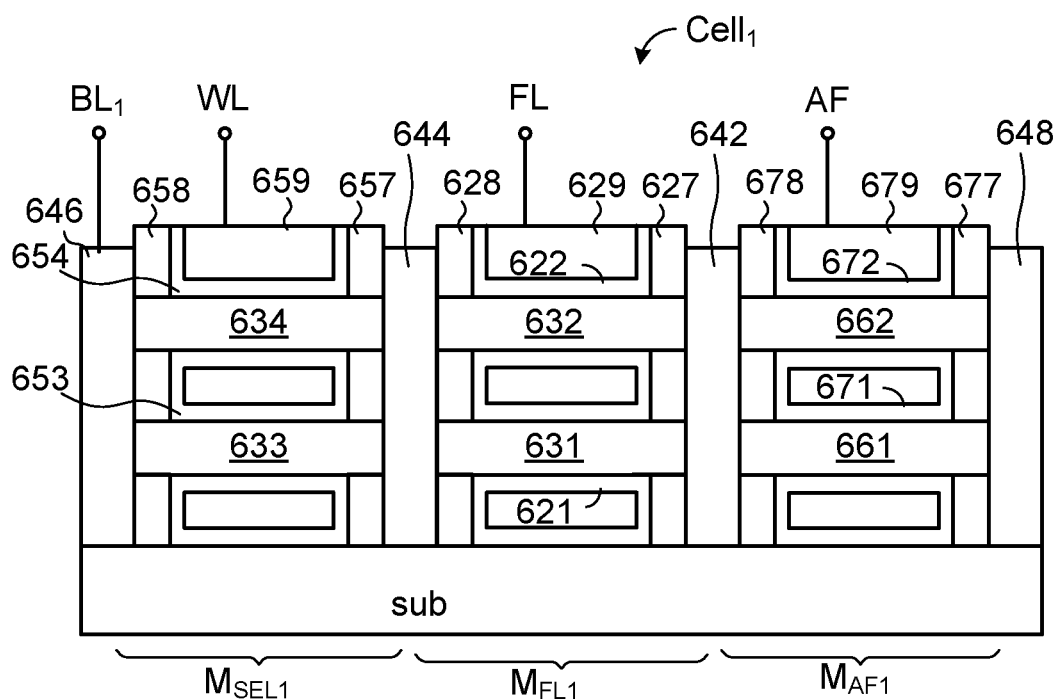
FIG. 7B is a schematic cross-sectional view illustrating the OTP memory as shown in FIG. 7A and taken along the dashed line j1-j2.

FIG. 7A is a schematic top view illustrating the structure of an OTP memory according to a fourth embodiment of the present invention. FIG. 7B is a schematic cross-sectional view illustrating the OTP memory as shown in FIG. 7A and taken along the dashed line j1-j2.

As shown in FIG. 7A, the OTP memory of the fourth embodiment comprises two memory cells $Cell_1$ and $Cell_2$, which have the same structures. The two memory cells $Cell_1$ and $Cell_2$ are respectively located beside a first side and a second side of an isolation wall 612. The memory cell $Cell_1$ comprises a select transistor $M_{SEL1}$, a following transistor $M_{FL1}$ and an antifuse transistor $M_{AF1}$. The memory cell $Cell_2$ comprises a select transistor $M_{SEL2}$, a following transistor $M_{FL2}$ and an antifuse transistor $M_{AF2}$. The select transistors $M_{SEL1}$ and $M_{SEL2}$, the following transistors $M_{FL1}$ and $M_{FL2}$ and the antifuse transistor $M_{AF1}$ and $M_{AF2}$ are forksheet transistors. Each of these transistors comprises two nanowires. The select transistors $M_{SEL1}$ and $M_{SEL2}$, the following transistors $M_{FL1}$ and $M_{FL2}$ and the antifuse transistor $M_{AF1}$ and $M_{AF2}$ are formed over the semiconductor substrate sub.

The select transistor $M_{SEL1}$ of the memory cell $Cell_1$ comprises a drain/source structure 644, a drain/source structure 646, a gate structure and two nanowires 633, 634. The gate structure of the select transistor $M_{SEL1}$ comprises a gate layer 659, two gate dielectric layers 653, 654 and two spacers 657, 658. The following transistor $M_{FL1}$ of the memory cell $Cell_1$ comprises a drain/source structure 642, the drain/source structure 644, a gate structure and two nanowires 631, 632. The gate structure of the following transistor $M_{FL1}$ comprises a gate layer 629, two gate dielectric layers 621, 622 and two spacers 627, 628. The antifuse transistor $M_{AF1}$ of the memory cell $Cell_1$ comprises a drain/source structure 648, the drain/source structure 642, a gate structure and two nanowires 661, 662. The gate structure of the antifuse transistor $M_{AF1}$ comprises a gate layer 679, two gate dielectric layers 671, 672 and two spacers 677, 678.

The select transistor $M_{SEL2}$ of the memory cell $Cell_2$ comprises a drain/source structure 684, a drain/source structure 686, a gate structure and two nanowires (one is the nanowire 636, and the other is not shown). The gate structure of the select transistor $M_{SEL2}$ comprises the gate layer 659, two gate dielectric layers (one is the gate dielectric layer 653, and the other is not shown) and two spacers 657, 658. The following transistor $M_{FL2}$ of the memory cell $Cell_2$ comprises a drain/source structure 682, the drain/source structure 684, a gate structure and two nanowires (one is the nanowire 635, and the other is not shown). The gate structure of the following transistor $M_{FL2}$ comprises a gate layer 629, two gate dielectric layers (one is the gate dielectric layer 625, and the other is not shown) and two spacers 627, 628. The antifuse transistor $M_{AF2}$ of the memory cell $Cell_2$ comprises a drain/source structure 688, the drain/source structure 682, a gate structure and two nanowires (one is the nanowire 663, and the other is not shown). The gate structure of the antifuse transistor $M_{AF2}$ comprises a gate layer 679, two gate dielectric layers (one is the gate dielectric layer 673, and the other is not shown) and two spacers 677, 678.

Please refer to FIG. 7A again. In the memory cell $Cell_1$, the drain/source structure 646 of the select transistor $M_{SEL1}$ is connected with a bit line $BL_1$, the gate layer 659 of the select transistor $M_{SEL1}$ is connected with a word line WL, the gate layer 629 of the following transistor $M_{FL1}$ is connected with a following line FL, and the gate layer 679 of the antifuse transistor $M_{AF1}$ is connected with an antifuse control line AF.

In the memory cell $Cell_2$, the drain/source structure 686 of the select transistor $M_{SEL2}$ is connected with a bit line $BL_2$, the gate layer 659 of the select transistor $M_{SEL2}$ is connected with the word line WL, the gate layer 629 of the following transistor $M_{FL2}$ is connected with the following line FL, and the gate layer 679 of the antifuse transistor $M_{AF2}$ is connected with the antifuse control line AF. In this embodiment, the memory cell $Cell_1$ and the memory cell $Cell_2$ are respectively connected with different bit lines $BL_1$ and $BL_2$. In addition, the word line WL, the following line FL and the antifuse control line AF are shared by the memory cell $Cell_1$ and the memory cell $Cell_2$.

Since the structures of the memory cells $Cell_1$ and $Cell_2$ are identical, only the structure of the memory cell $Cell_1$ will be described as follows.

As shown in FIG. 7B, the select transistor $M_{SEL1}$ of the memory cell $Cell_1$ comprises the drain/source structure 644, the drain/source structure 646, the gate structure and the two nanowires 633, 634. The gate structure is located over the semiconductor substrate sub. The gate structure comprises the gate layer 659, the two gate dielectric layers 653, 654 and the two spacers 657, 658. A first-portion surface of the nanowire 633 is contacted with the isolation wall 612. A second-portion surface of the nanowire 633 is contacted with the gate structure. A first-portion surface of the nanowire 634 is contacted with the isolation wall 612. A second-portion surface of the nanowire 634 is contacted with the gate structure. A central region of the nanowire 633 is contacted with the gate dielectric layer 653. A central region of the nanowire 634 is contacted with the gate dielectric layer 654. The gate dielectric layers 653 and 654 are covered by the gate layer 659. The gate layer 659 is located over the semiconductor substrate sub. A first side region of the nanowire 633 is contacted with the spacer 657 and supported by the spacer 657. A second side region of the nanowire 633 is contacted with the spacer 658 and supported by the spacer 658. A first side region of the nanowire 634 is contacted with the spacer 657 and supported by the spacer 657. A second side region of the nanowire 634 is contacted with the spacer 658 and supported by the spacer 658. In addition, the spacers 657 and 658 are formed on the semiconductor substrate sub. The portions of the nanowires 633 and 634 that are contacted with the gate structure are collaboratively served as a nanowire channel region of the select transistor $M_{SEL1}$. The drain/source structures 644 and 646 are formed over the semiconductor substrate sub and respectively located beside two sides of the gate structure. The drain/source structure 644 is electrically contacted with the first terminals of the nanowires 633 and 634. The drain/source structure 646 is electrically contacted with the second terminals of the nanowire 633 and 634.

The following transistor $M_{FL1}$ of the memory cell $Cell_1$ comprises the drain/source structure 642, the drain/source structure 644, the gate structure and the two nanowires 631, 632. The gate structure is located over the semiconductor substrate sub. The gate structure comprises the gate layer 629, the two gate dielectric layers 621, 622 and the two spacers 627, 628. A first-portion surface of the nanowire 631 is contacted with the isolation wall 612. A second-portion surface of the nanowire 631 is contacted with the gate structure. A first-portion surface of the nanowire 632 is contacted with the isolation wall 612. A second-portion surface of the nanowire 632 is contacted with the gate structure. A central region of the nanowire 631 is contacted with the gate dielectric layer 621. A central region of the nanowire 632 is contacted with the gate dielectric layer 622. The gate dielectric layers 621 and 622 are covered by the gate layer 629. The gate layer 629 is located over the semiconductor substrate sub. A first side region of the nanowire 631 is contacted with the spacer 627 and supported by the spacer 627. A second side region of the nanowire 631 is contacted with the spacer 628 and supported by the spacer 628. A first side region of the nanowire 632 is contacted with the spacer 627 and supported by the spacer 627. A second side region of the nanowire 632 is contacted with the spacer 628 and supported by the spacer 628. In addition, the spacers 627 and 628 are formed on the semiconductor substrate sub. The portions of the nanowires 631 and 632 that are contacted with the gate structure are collaboratively served as a nanowire channel region of the following transistor $M_{FL1}$. The drain/source structures 642 and 644 are formed over the semiconductor substrate sub and respectively located beside two sides of the gate structure. The drain/source structure 642 is electrically contacted with the first terminals of the nanowires 631 and 632. The drain/source structure 644 is electrically contacted with the second terminals of the nanowire 631 and 632.

The antifuse transistor $M_{AF1}$ of the memory cell $Cell_1$ comprises the drain/source structure 648, the drain/source structure 642, the gate structure and the two nanowires 661, 662. The gate structure is located over the semiconductor substrate sub. The gate structure comprises the gate layer 679, the two gate dielectric layers 671, 672 and the two spacers 677, 678. A first-portion surface of the nanowire 661 is contacted with the isolation wall 612. A second-portion surface of the nanowire 661 is contacted with the gate structure. A first-portion surface of the nanowire 662 is contacted with the isolation wall 612. A second-portion surface of the nanowire 662 is contacted with the gate structure. A central region of the nanowire 661 is contacted with the gate dielectric layer 671. A central region of the nanowire 662 is contacted with the gate dielectric layer 672. The gate dielectric layers 671 and 672 are covered by the gate layer 679. The gate layer 679 is located over the semiconductor substrate sub. A first side region of the nanowire 661 is contacted with the spacer 677 and supported by the spacer 677. A second side region of the nanowire 661 is contacted with the spacer 678 and supported by the spacer 678. A first side region of the nanowire 662 is contacted with the spacer 677 and supported by the spacer 677. A second side region of the nanowire 662 is contacted with the spacer 678 and supported by the spacer 678. In addition, the spacers 677 and 678 are formed on the semiconductor substrate sub. The portions of the nanowires 661 and 662 that are contacted with the gate structure are collaboratively served as a nanowire channel region of the antifuse transistor $M_{AF1}$. The drain/source structures 648 and 642 are formed over the semiconductor substrate sub and respectively located beside two sides of the gate structure. The drain/source structure 648 is electrically contacted with the first terminals of the nanowires 661 and 662. The drain/source structure 642 is electrically contacted with the second terminals of the nanowire 661 and 662.

In this embodiment, the drain/source structure 644 is shared by the select transistor $M_{SEL1}$ and the following transistor $M_{FL1}$, and the drain/source structure 644 is shared by the following transistor $M_{FL1}$ and the antifuse transistor $M_{AF1}$. In an embodiment, the drain/source structures 642, 644, 646 and 648 and the nanowires 631, 632, 633, 634, 661 and 662 have the same dopant type. For example, the drain/source structures 642, 644, 646 and 648 and the nanowires 631, 632, 633, 634, 661 and 662 are n-type doped regions or p-type doped regions.

In the memory cell $Cell_1$, the drain/source structure 646 of the select transistor $M_{SEL1}$ is connected with a bit line $BL_1$, the gate layer 659 of the select transistor $M_{SEL1}$ is connected with a word line WL, the gate layer 629 of the following transistor $M_{FL1}$ is connected with a following line FL, and the gate layer 679 of the antifuse transistor $M_{AF1}$ is connected with an antifuse control line AF. In addition, the nanowires 631, 632, 633, 634, 661 and 662 of the memory cell $Cell_1$ are rectangular nanowires or cylindrical nanowires.

It is noted that the structure of the memory cell $Cell_1$ in the OTP memory of the first embodiment may be properly modified. In a variant example, the thicknesses of the gate dielectric layers 653 and 654 of the gate structure in the select transistor $M_{SEL1}$ are larger than the thicknesses of the gate dielectric layers 671 and 672 of the gate structure in the antifuse transistor $M_{AF1}$.

In another variant example, the cross section areas of the nanowires in the select transistor $M_{SEL1}$ and the antifuse transistor $M_{AF1}$ are modified. For example, the cross section area of each of the nanowires 661 and 662 in the antifuse transistor $M_{AF1}$ is smaller than the cross section area of each of the nanowires 633 and 634 in the select transistor $M_{SEL1}$.

In the memory cell $Cell_1$ of the OTP memory of the fourth embodiment, each of the select transistor $M_{SEL1}$, the following transistor $M_{FL}$ and the antifuse transistor $M_{AF1}$ has three nanowires. It is noted that numerous modifications and alterations may be made while retaining the teachings of the invention. For example, in some other embodiments, the select transistor $M_{SEL1}$ has X nanowires, the following transistor $M_{FL}$ has Y nanowires, and the antifuse transistor $M_{AF1}$ has Z nanowires, wherein X, Y and Z are positive integers. It is noted that X, Y and Z may be identical or different. The select transistor $M_{SEL1}$, the following transistor $M_{FL}$ and the antifuse transistor $M_{AF1}$ are integrated as a memory cell of the OTP memory.

Figure 8A:
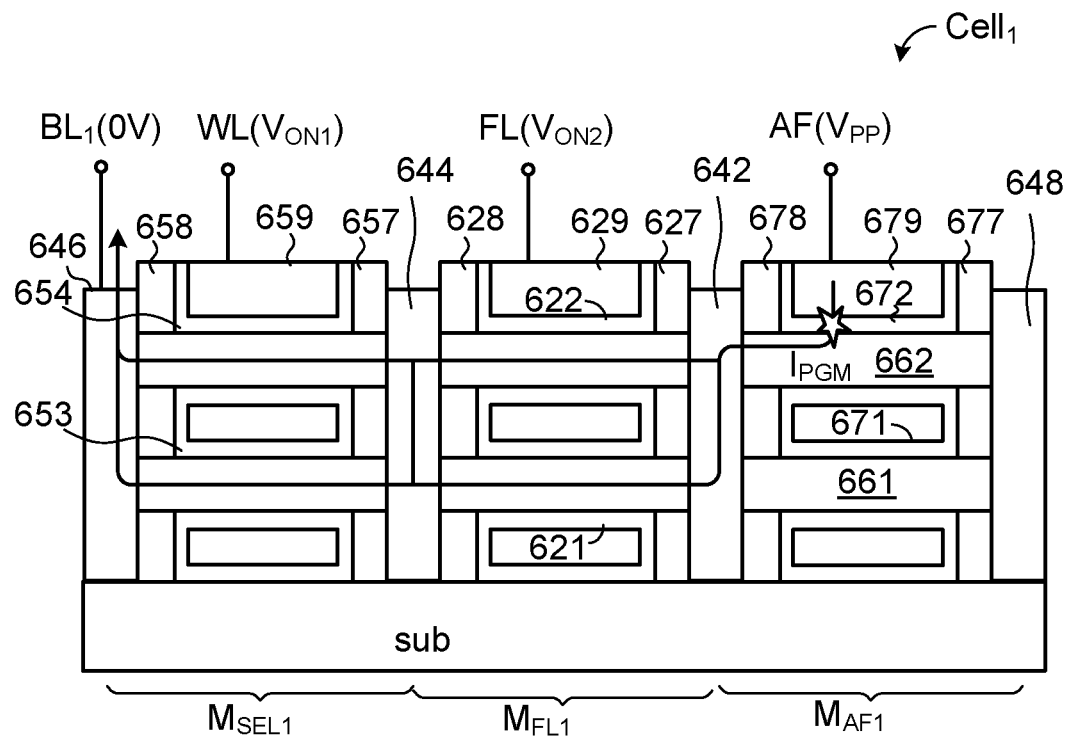
FIG. 8A schematically illustrates associated bias voltages for performing a program action on the OTP memory according to the fourth embodiment of the present invention.
Figure 8B:
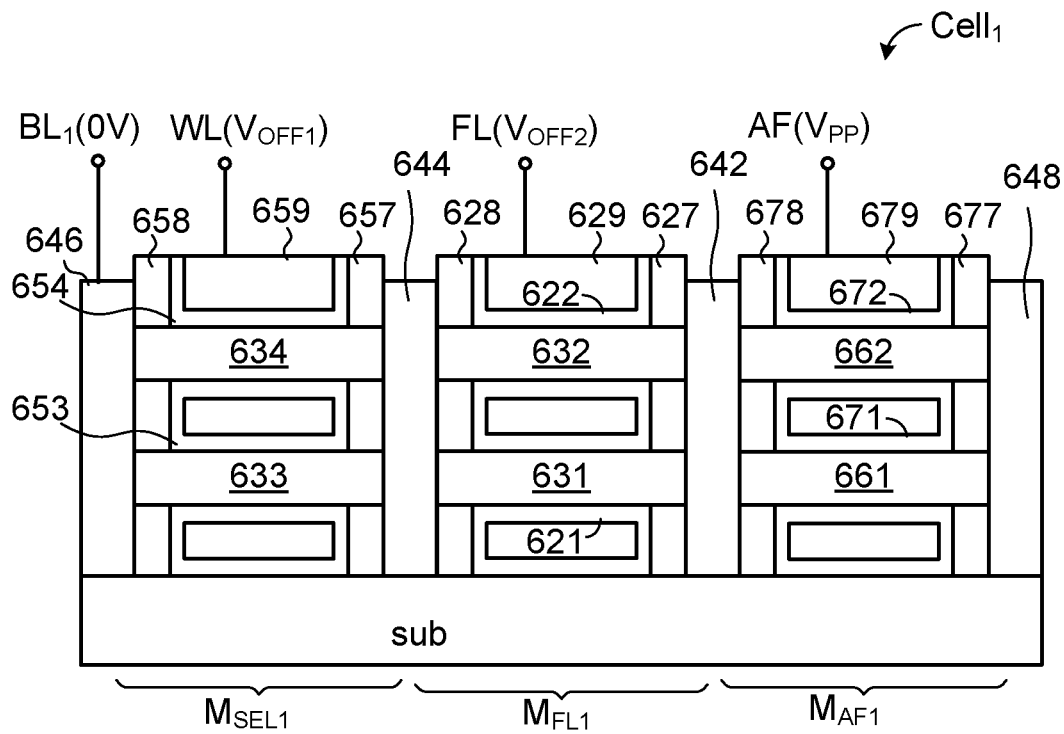
FIG. 8B schematically illustrates associated bias voltages for performing a program inhibition action on the OTP memory according to the fourth embodiment of the present invention.
Figure 8C:
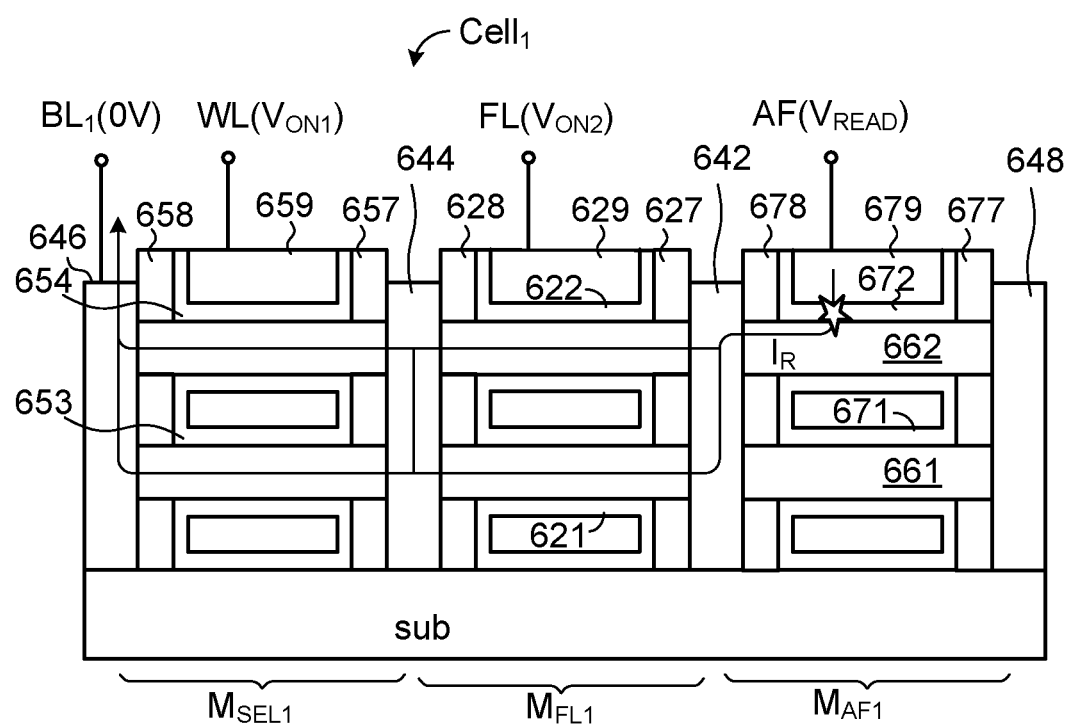
FIG. 8C schematically illustrates associated bias voltages for performing a read action on the OTP memory according to the fourth embodiment of the present invention.

FIG. 8A schematically illustrates associated bias voltages for performing a program action on the OTP memory according to the fourth embodiment of the present invention. FIG. 8B schematically illustrates associated bias voltages for performing a program inhibition action on the OTP memory according to the fourth embodiment of the present invention. FIG. 8C schematically illustrates associated bias voltages for performing a read action on the OTP memory according to the fourth embodiment of the present invention.

Please refer to FIG. 8A. When the program action is performed on the memory cell $Cell_1$ of the OTP memory, the antifuse control line AF receives a program voltage $V_{PP}$, the bit line $BL_1$ receives a ground voltage (0V), the word line WL receives a first on voltage $V_{ON1}$, and the following line FL receives a second on voltage $V_{ON2}$. For example, the program voltage $V_{PP}$ is in the range between 3V and 6V, the first on voltage $V_{ON1}$ is in the range between 0.4V and 3V, and the second on voltage $V_{ON2}$ is in the range between 0.4V and 3V. In addition, the second on voltage $V_{ON2}$ is higher than or equal to the first on voltage $V_{ON1}$.

When the program action is performed, the select transistor $M_{SEL1}$ and the following transistor $M_{FL1}$ of the memory cell $Cell_1$ are turned on. Consequently, the ground voltage (0V) of the bit line $BL_1$ is transmitted to the drain/source structure 642 of the antifuse transistor $M_{AF1}$ through the nanowires of the select transistor $M_{SEL1}$ and the following transistor $M_{FL1}$. When the antifuse control line AF receives the program voltage $V_{PP}$, the voltage stress between the nanowires 661, 662 and the gate layer 679 of the antifuse transistor $M_{AF1}$ is equal to the program voltage $V_{PP}$. Under this circumstance, one of the gate dielectric layers 671 and 672 of the antifuse transistor $M_{AF1}$ is ruptured. Consequently, the memory cell $Cell_1$ generates a program current $I_{PGM}$. The program current $I_{PGM}$ flows from the antifuse control line AF to the bit line $BL_1$. Consequently, the region between the gate layer 679 and the drain/source structure 642 of the antifuse transistor $M_{AF1}$ has a low resistance value. That is, the memory cell $Cell_1$ is programmed to a low-resistance storage state.

Please refer to FIG. 8B. When the program inhibition action is performed, the antifuse control line AF receives the program voltage $V_{PP}$, the bit line $BL_1$ receives the ground voltage (0V), the word line WL receives a first off voltage $V_{OFF1}$, and the following line FL receives a second off voltage $V_{OFF2}$. Thus, the select transistor $M_{SEL1}$ and the following transistor $M_{FL1}$ of the memory cell $Cell_1$ are turned off. Consequently, the ground voltage (0V) of the bit line $BL_1$ cannot be transmitted to the drain/source structure 642 of the antifuse transistor $M_{AF1}$. When the antifuse control line AF receives the program voltage $V_{PP}$, the voltage stress between the gate layer 679 and the drain/source structure 642 of the antifuse transistor $M_{AF1}$ is very low. Under this circumstance, the program current $I_{PGM}$ is not generated, and one of the gate dielectric layers 671 and 672 of the antifuse transistor $M_{AF1}$ is not ruptured. Consequently, the region between the gate layer 679 and the drain/source structure 642 of the antifuse transistor $M_{AF1}$ is maintained in a high resistance value. That is, the memory cell $Cell_1$ is maintained in a high-resistance storage state.

Similarly, since the word line WL and the following line FL are shared by the memory cell $Cell_1$ and the memory cell $Cell_2$, the storage state of the memory cell $Cell_2$ is also not changed when the word line WL receives the first off voltage $V_{OFF1}$ and the following line FL receives the second off voltage $V_{OFF2}$.

In another embodiment, when the program inhibition action is performed on the memory cell $Cell_1$, the antifuse control line AF is in a floating state. Consequently, regardless of whether the select transistor $M_{SEL1}$ and the following transistor $M_{FL1}$ are turned on or turned off, the gate dielectric layers 671 and 672 of the antifuse transistor $M_{AF1}$ are not ruptured. That is, the memory cell $Cell_1$ is maintained in the high-resistance storage state. Alternatively, when the program inhibition action is performed on the memory cell $Cell_1$, the voltage provided to the bit line $BL_1$ is equal to the first on voltage $V_{ON1}$. Consequently, the memory cell $Cell_1$ is also maintained in the high-resistance storage state.

Please refer to FIG. 8C. When the read action is performed, the antifuse control line AF receives a read voltage VREAD, the bit line $BL_1$ receives the ground voltage (0V), the word line WL receives the first on voltage $V_{ON1}$, and the following line FL receives the second on voltage $V_{ON2}$. For example, the read voltage VREAD is in the range between 0.4V and 1.6V. When the read action is performed, the select transistor $M_{SEL1}$ and the following transistor $M_{FL1}$ of the memory cell $Cell_1$ are turned on. Since the gate dielectric layer 672 of the antifuse transistor $M_{AF1}$ is ruptured, the region between the gate layer 679 and the drain/source structure 642 of the antifuse transistor $M_{AF1}$ has a low resistance value. Under this circumstance, a higher read current $I_R$ is generated between the antifuse control line AF and the bit line $BL_1$.

Whereas, if the gate dielectric layers 671 and 672 of the antifuse transistor $M_{AF1}$ in the memory cell $Cell_1$ are not ruptured, the magnitude of the current $I_R$ generated between the antifuse control line AF and the bit line $BL_1$ is very low (e.g., nearly zero). In other words, the storage state of the memory cell $Cell_1$ can be determined as the high-resistance storage state or the low-resistance storage state according to the magnitude of the generated read current $I_R$ during the read action.

Figure 9:
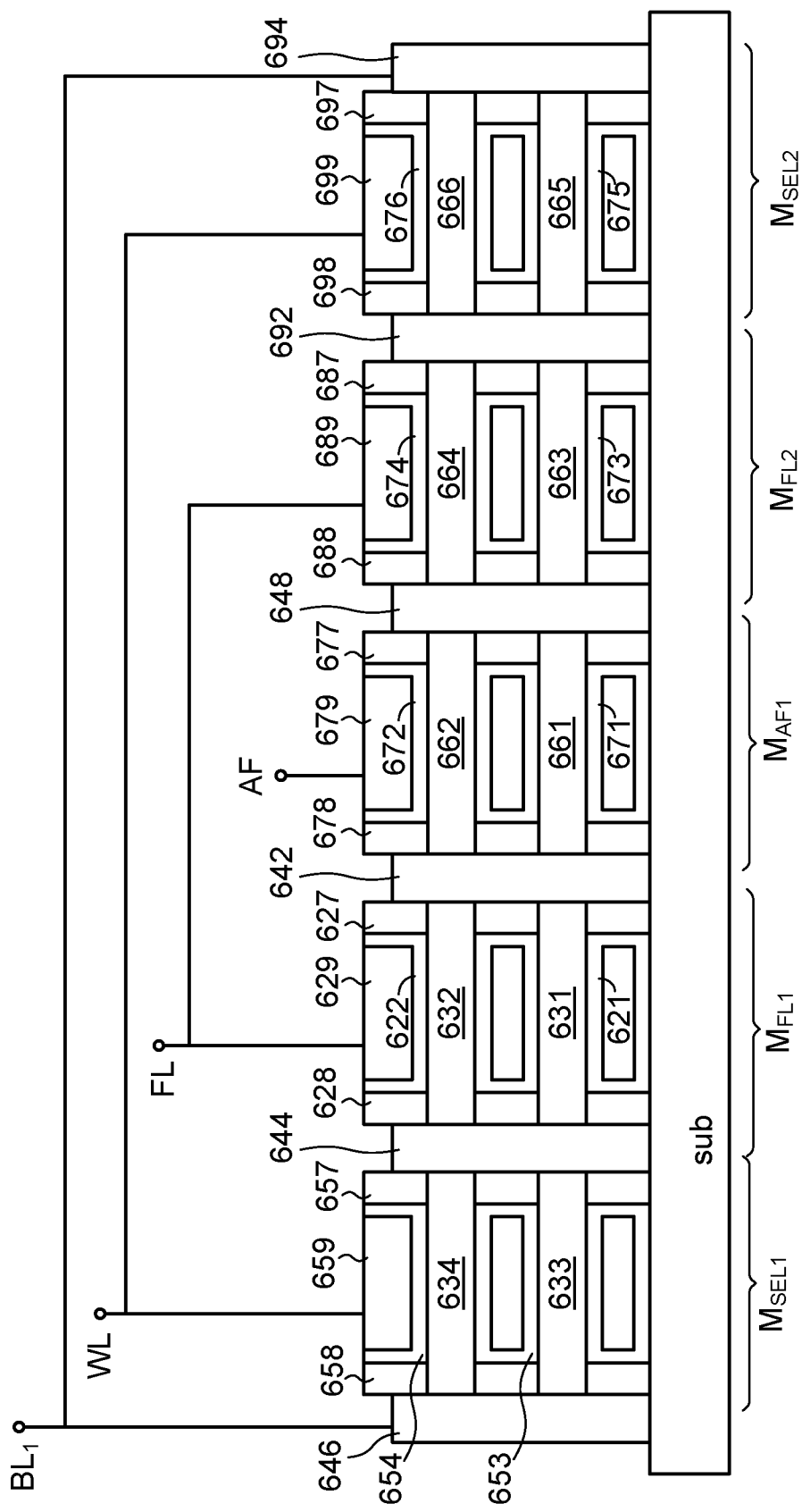
FIG. 9 is a schematic cross-sectional view illustrating the structure of a memory cell of an OTP memory according to a fifth embodiment of the present invention.

FIG. 9 is a schematic cross-sectional view illustrating the structure of a memory cell of an OTP memory according to a fifth embodiment of the present invention. The OTP memory of the fifth embodiment comprises two memory cells, which have the same structures. The two memory cells are respectively located beside a first side and a second side of an isolation wall (not shown). In comparison with the memory cell $Cell_1$ of the OTP memory of the fourth embodiment, the memory cell of the OTP memory of the fifth embodiment comprises two additional forksheet transistors. For succinctness, only the structures of the two additional forksheet transistors will be described as follows. The other structures of the memory cell of this embodiment are similar to those of the memory cell $Cell_1$ of the OTP memory of the fourth embodiment, and not redundantly described herein.

In the OTP memory of the fifth embodiment, the memory cell comprises a select transistor $M_{SEL1}$, a following transistor $M_{FL1}$, an antifuse transistor $M_{AF1}$, a following transistor $M_{FL2}$ and a select transistor $M_{SEL2}$. The select transistor $M_{SEL1}$, the following transistor $M_{FL1}$, the antifuse transistor $M_{AF1}$, the following transistor $M_{FL2}$ and the select transistor $M_{SEL2}$ are formed over the semiconductor substrate sub. In comparison with the memory cell of the OTP memory of the fourth embodiment, the memory cell of the OTP memory of the fifth embodiment further comprises the following transistor $M_{FL2}$ and the select transistor $M_{SEL2}$.

The following transistor $M_{FL2}$ comprises a drain/source structure 692, the drain/source structure 648, a gate structure and two nanowires 663, 664. The gate structure is located over the semiconductor substrate sub. The gate structure comprises a gate layer 689, two gate dielectric layers 673, 674 and two spacers 687, 688. A first-portion surface of the nanowire 663 is contacted with the isolation wall. A second-portion surface of the nanowire 663 is contacted with the gate structure. A first-portion surface of the nanowire 664 is contacted with the isolation wall. A second-portion surface of the nanowire 664 is contacted with the gate structure. A central region of the nanowire 663 is contacted with the gate dielectric layer 673. A central region of the nanowire 664 is contacted with the gate dielectric layer 674. The gate dielectric layers 673 and 674 are covered by the gate layer 679. The gate layer 679 is located over the semiconductor substrate sub. A first side region of the nanowire 663 is contacted with the spacer 687 and supported by the spacer 687. A second side region of the nanowire 663 is contacted with the spacer 688 and supported by the spacer 688. A first side region of the nanowire 664 is contacted with the spacer 687 and supported by the spacer 687. A second side region of the nanowire 664 is contacted with the spacer 688 and supported by the spacer 688. In addition, the spacers 687 and 688 are formed on the semiconductor substrate sub. The portions of the nanowires 663 and 664 that are contacted with the gate structure are collaboratively served as a nanowire channel region of the following transistor $M_{FL2}$. The two drain/source structures 692 and 648 are formed over the semiconductor substrate sub and respectively located beside two sides of the gate structure. The drain/source structure 692 is electrically contacted with the first terminals of the nanowires 663 and 664. The drain/source structure 648 is electrically contacted with the second terminals of the nanowires 663 and 664.

The select transistor $M_{SEL2}$ comprises a drain/source structure 694, the drain/source structure 692, a gate structure and two nanowires 665, 666. The gate structure is located over the semiconductor substrate sub. The gate structure comprises a gate layer 699, two gate dielectric layers 675, 676 and the two spacers 697, 698. A first-portion surface of the nanowire 665 is contacted with the isolation wall. A second-portion surface of the nanowire 665 is contacted with the gate structure. A first-portion surface of the nanowire 666 is contacted with the isolation wall. A second-portion surface of the nanowire 666 is contacted with the gate structure. A central region of the nanowire 665 is contacted with the gate dielectric layer 675. A central region of the nanowire 666 is contacted with the gate dielectric layer 676. The gate dielectric layers 675 and 676 are covered by the gate layer 689. The gate layer 689 is located over the semiconductor substrate sub. A first side region of the nanowire 665 is contacted with the spacer 697 and supported by the spacer 697. A second side region of the nanowire 665 is contacted with the spacer 698 and supported by the spacer 698. A first side region of the nanowire 666 is contacted with the spacer 697 and supported by the spacer 697. A second side region of the nanowire 666 is contacted with the spacer 698 and supported by the spacer 698. In addition, the spacers 697 and 698 are formed on the semiconductor substrate sub. The portions of the nanowires 665 and 666 that are contacted with the gate structure are collaboratively served as a nanowire channel region of the select transistor $M_{SEL2}$. The two drain/source structures 694 and 692 are formed over the semiconductor substrate sub and respectively located beside two sides of the gate structure. The drain/source structure 694 is electrically contacted with the first terminals of the nanowires 665 and 666. The drain/source structure 692 is electrically contacted with the second terminals of the nanowire 665 and 666.

In this embodiment, the drain/source structure 648 is shared by the following transistor $M_{FL2}$ and the antifuse transistor $M_{AF1}$, and the drain/source structure 692 is shared by the select transistor $M_{SEL2}$ and the following transistor $M_{FL2}$. In an embodiment, the drain/source structures 694, 692, 642, 644, 646 and 648 and the nanowires 631, 632, 633, 634, 661, 662, 663, 664, 665 and 666 have the same dopant type. For example, the drain/source structures 694, 692, 642, 644, 646 and 648 and the nanowires 631, 632, 633, 634, 661, 662, 663, 664, 665 and 666 are n-type doped regions or p-type doped regions.

In the memory cell, the drain/source structures 646 and 694 are connected with a bit line $BL_1$, the gate layer 659 of the select transistor $M_{SEL1}$ and the gate layer 699 of the select transistor $M_{SEL2}$ are connected with a word line WL, the gate layer 629 of the following transistor $M_{FL1}$ and the gate layer 689 of the following transistor $M_{FL2}$ are connected with a following line FL, and the gate layer 679 of the antifuse transistor $M_{AF1}$ is connected with an anifuse control line AF.

The bias voltages for performing the program action, the program inhibition action and the read action on the memory cell of the fifth embodiment are similar to those of the fourth embodiment, and not redundantly described herein.

In the memory cell of the OTP memory of the fifth embodiment, each of the select transistor $M_{SEL1}$, the following transistor $M_{FL1}$, the antifuse transistor $M_{AF1}$, the following transistor $M_{AF1}$ and the select transistor $M_{SEL1}$ has two nanowires. It is noted that numerous modifications and alterations may be made while retaining the teachings of the invention. For example, in some other embodiments, the select transistor $M_{SEL1}$ has W nanowires, the following transistor $M_{FL1}$ has X nanowires, the antifuse transistor $M_{AF1}$ has Y nanowires, and the following transistor $M_{FL2}$ has Z nanowires, wherein W, X, Y and Z are positive integers. It is noted that W, X, Y and Z may be identical or different.

Figure 10:
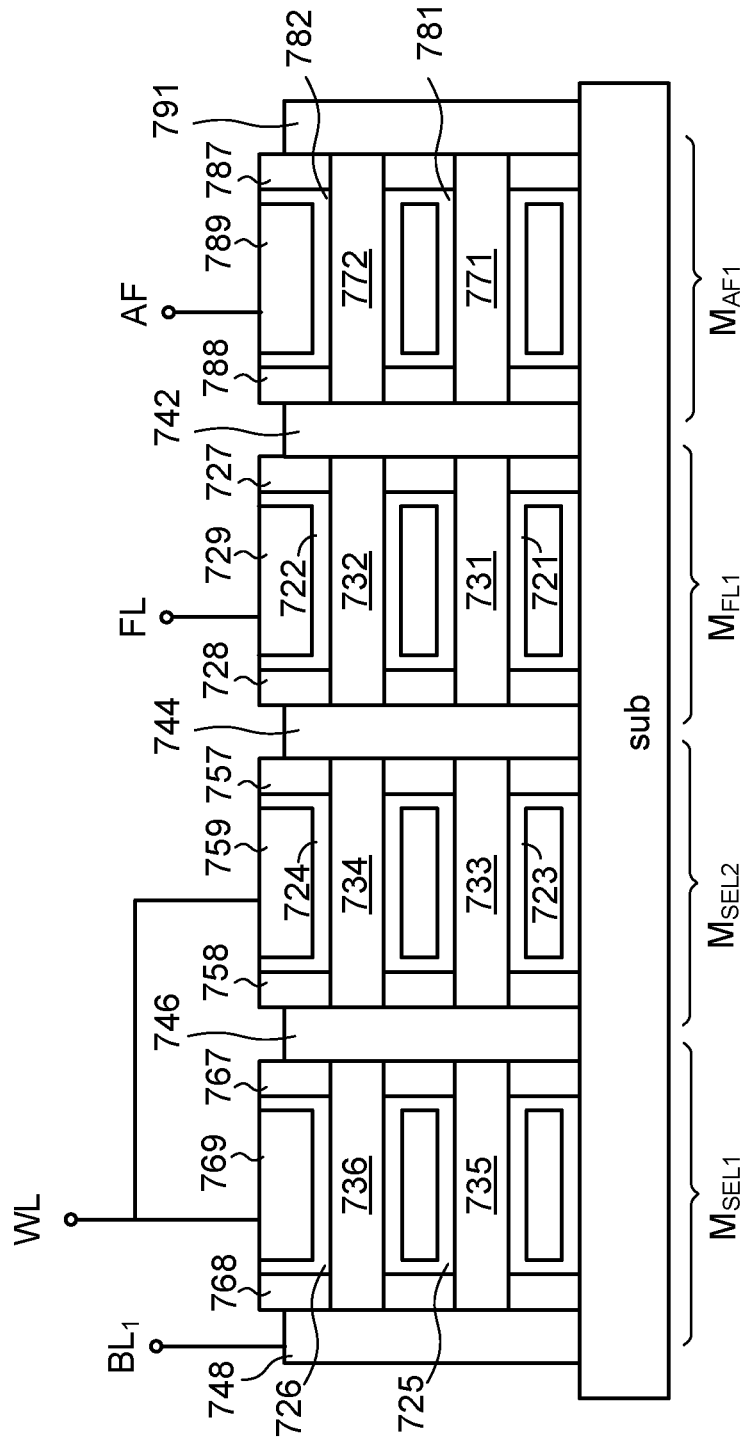
FIG. 10 is a schematic cross-sectional view illustrating the structure of a memory cell of an OTP memory according to a sixth embodiment of the present invention.

FIG. 10 is a schematic cross-sectional view illustrating the structure of a memory cell of an OTP memory according to a sixth embodiment of the present invention. The OTP memory of the sixth embodiment comprises two memory cells, which have the same structures. The two memory cells are respectively located beside a first side and a second side of an isolation wall (not shown). For succinctness, only the structure of one memory cell beside a side of the isolation wall will be described as follows.

In the sixth embodiment, the memory cell of the OTP memory of comprises a select transistor $M_{SEL1}$, a select transistor $M_{SEL2}$, a following transistor $M_{FL1}$ and an antifuse transistor $M_{AF1}$. The select transistor $M_{SEL1}$, the select transistor $M_{SEL2}$, the following transistor $M_{FL1}$ and the antifuse transistor $M_{AF1}$ are forksheet transistors. Each of these transistors comprises two nanowires. The select transistor $M_{SEL1}$, the select transistor $M_{SEL2}$, the following transistor $M_{FL1}$ and the antifuse transistor $M_{AF1}$ are formed over the semiconductor substrate sub.

The select transistor $M_{SEL1}$ comprises a drain/source structure 746, a drain/source structure 748, a gate structure and two nanowires 735, 736. The gate structure is located over the semiconductor substrate sub. The gate structure comprises a gate layer 769, two gate dielectric layers 725, 726 and two spacers 767, 768. A first-portion surface of the nanowire 735 is contacted with the isolation wall. A second-portion surface of the nanowire 735 is contacted with the gate structure. A first-portion surface of the nanowire 736 is contacted with the isolation wall. A second-portion surface of the nanowire 736 is contacted with the gate structure. A central region of the nanowire 735 is contacted with the gate dielectric layer 725. A central region of the nanowire 736 is contacted with the gate dielectric layer 726. The gate dielectric layers 725 and 726 are covered by the gate layer 769. The gate layer 769 is located over the semiconductor substrate sub. A first side region of the nanowire 735 is contacted with the spacer 767 and supported by the spacer 767. A second side region of the nanowire 735 is contacted with the spacer 768 and supported by the spacer 768. A first side region of the nanowire 736 is contacted with the spacer 767 and supported by the spacer 767. A second side region of the nanowire 736 is contacted with the spacer 768 and supported by the spacer 768. In addition, the spacers 767 and 768 are formed on the semiconductor substrate sub. The portions of the nanowires 735 and 736 that are contacted with the gate structure are collaboratively served as a nanowire channel region of the select transistor $M_{SEL1}$. The drain/source structures 746 and 748 are formed over the semiconductor substrate sub and respectively located beside two sides of the gate structure. The drain/source structure 746 is electrically contacted with the first terminals of the nanowires 735 and 736. The drain/source structure 748 is electrically contacted with the second terminals of the nanowire 735 and 736.

The select transistor $M_{SEL2}$ comprises a drain/source structure 744, a drain/source structure 746, a gate structure and two nanowires 733, 734. The gate structure is located over the semiconductor substrate sub. The gate structure comprises a gate layer 759, two gate dielectric layers 723, 724 and two spacers 757, 758. A first-portion surface of the nanowire 733 is contacted with the isolation wall. A second-portion surface of the nanowire 733 is contacted with the gate structure. A first-portion surface of the nanowire 734 is contacted with the isolation wall. A second-portion surface of the nanowire 734 is contacted with the gate structure. A central region of the nanowire 733 is contacted with the gate dielectric layer 723. A central region of the nanowire 734 is contacted with the gate dielectric layer 724. The gate dielectric layers 723 and 724 are covered by the gate layer 759. The gate layer 759 is located over the semiconductor substrate sub. A first side region of the nanowire 733 is contacted with the spacer 757 and supported by the spacer 757. A second side region of the nanowire 733 is contacted with the spacer 758 and supported by the spacer 758. A first side region of the nanowire 734 is contacted with the spacer 757 and supported by the spacer 757. A second side region of the nanowire 734 is contacted with the spacer 758 and supported by the spacer 758. In addition, the spacers 757 and 758 are formed on the semiconductor substrate sub. The portions of the nanowires 733 and 734 that are contacted with the gate structure are collaboratively served as a nanowire channel region of the select transistor $M_{SEL2}$. The two drain/source structures 744 and 746 are formed over the semiconductor substrate sub and respectively located beside two sides of the gate structure. The drain/source structure 744 is electrically contacted with the first terminals of the nanowires 733 and 734. The drain/source structure 746 is electrically contacted with the second terminals of the nanowire 733 and 734.

The following transistor $M_{FL1}$ comprises a drain/source structure 742, a drain/source structure 744, a gate structure and two nanowires 731, 732. The gate structure is located over the semiconductor substrate sub. The gate structure comprises a gate layer 729, two gate dielectric layers 721, 722 and two spacers 727, 728. A first-portion surface of the nanowire 731 is contacted with the isolation wall. A second-portion surface of the nanowire 731 is contacted with the gate structure. A first-portion surface of the nanowire 732 is contacted with the isolation wall. A second-portion surface of the nanowire 732 is contacted with the gate structure. A central region of the nanowire 731 is contacted with the gate dielectric layer 721. A central region of the nanowire 732 is contacted with the gate dielectric layer 722. The gate dielectric layers 721 and 722 are covered by the gate layer 729. The gate layer 729 is located over the semiconductor substrate sub. A first side region of the nanowire 731 is contacted with the spacer 727 and supported by the spacer 727. A second side region of the nanowire 731 is contacted with the spacer 728 and supported by the spacer 728. A first side region of the nanowire 732 is contacted with the spacer 727 and supported by the spacer 727. A second side region of the nanowire 732 is contacted with the spacer 728 and supported by the spacer 728. In addition, the spacers 727 and 728 are formed on the semiconductor substrate sub. The portions of the nanowires 731 and 732 that are contacted with the gate structure are collaboratively served as a nanowire channel region of the following transistor $M_{FL1}$. The drain/source structures 742 and 744 are formed over the semiconductor substrate sub and respectively located beside two sides of the gate structure. The drain/source structure 742 is electrically contacted with the first terminals of the nanowires 731 and 732. The drain/source structure 744 is electrically contacted with the second terminals of the nanowire 731 and 732.

The antifuse transistor $M_{AF1}$ comprises a drain/source structure 791, the drain/source structure 742, a gate structure and two nanowires 771, 772. The gate structure is located over the semiconductor substrate sub. The gate structure comprises a gate layer 789, two gate dielectric layers 781, 782 and two spacers 787, 788. A first-portion surface of the nanowire 771 is contacted with the isolation wall. A second-portion surface of the nanowire 771 is contacted with the gate structure. A first-portion surface of the nanowire 772 is contacted with the isolation wall. A second-portion surface of the nanowire 772 is contacted with the gate structure. A central region of the nanowire 771 is contacted with the gate dielectric layer 781. A central region of the nanowire 772 is contacted with the gate dielectric layer 782. The gate dielectric layers 781 and 782 are covered by the gate layer 789. The gate layer 789 is located over the semiconductor substrate sub. A first side region of the nanowire 771 is contacted with the spacer 787 and supported by the spacer 787. A second side region of the nanowire 771 is contacted with the spacer 788 and supported by the spacer 788. A first side region of the nanowire 772 is contacted with the spacer 787 and supported by the spacer 787. A second side region of the nanowire 772 is contacted with the spacer 788 and supported by the spacer 788. In addition, the spacers 787 and 788 are formed on the semiconductor substrate sub. The portions of the nanowires 771 and 772 that are contacted with the gate structure are collaboratively served as a nanowire channel region of the antifuse transistor $M_{AF1}$. The drain/source structures 791 and 742 are formed on the semiconductor substrate sub and respectively located beside two sides of the gate structure. The drain/source structure 791 is electrically contacted with the first terminals of the nanowires 771 and 772. The drain/source structure 742 is electrically contacted with the second terminals of the nanowires 771 and 772.

In this embodiment, the drain/source structure 746 is shared by the select transistor $M_{SEL1}$ and the select transistor $M_{SEL2}$, the drain/source structure 744 is shared by the select transistor $M_{SEL2}$ and the following transistor $M_{FL1}$, and the drain/source structure 742 is shared by the following transistor $M_{FL1}$ and the antifuse transistor $M_{AF1}$. In an embodiment, the drain/source structures 791, 742, 744, 746 and 748 and the nanowires 731, 732, 733, 734, 735, 736, 771 and 772 have the same dopant type. For example, the drain/source structures 791, 742, 744, 746 and 748 and the nanowires 731, 732, 733, 734, 735, 736, 771 and 772 are n-type doped regions or p-type doped regions.

In the memory cell, the drain/source structure 748 of the select transistor $M_{SEL1}$ is connected with a bit line $BL_1$, the gate layer 769 of the select transistor $M_{SEL1}$ is connected with a word line WL, the gate layer 759 of the select transistor $M_{SEL2}$ is connected with the word line WL, the gate layer 729 of the following transistor $M_{FL1}$ is connected with a following line FL, and the gate layer 789 of the antifuse transistor $M_{AF1}$ is connected with an antifuse control line AF. In addition, the nanowires 731, 732, 733, 734, 735, 736, 771 and 772 of the memory cell are rectangular nanowires or cylindrical nanowires.

The bias voltages for performing the program action, the program inhibition action and the read action on the memory cell of the sixth embodiment are similar to those of the fourth embodiment, and not redundantly described herein.

Figure 11:
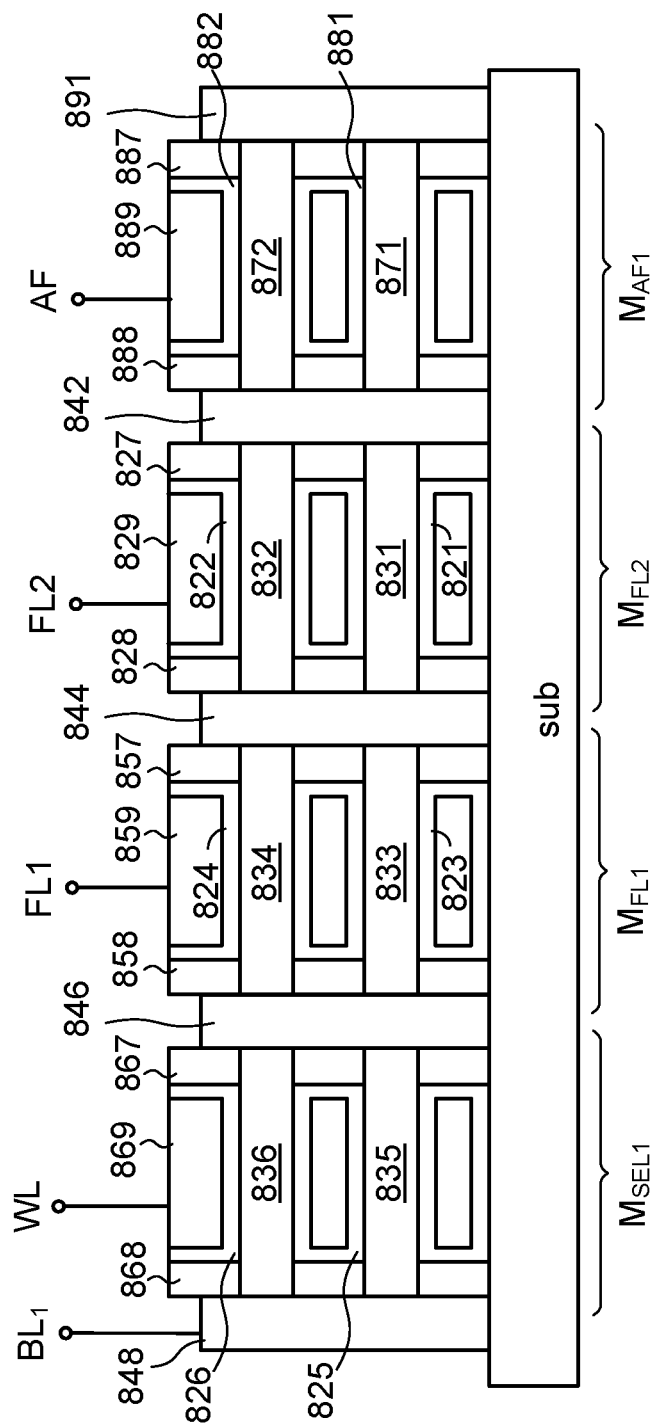
FIG. 11 is a schematic cross-sectional view illustrating the structure of a memory cell of an OTP memory according to a seventh embodiment of the present invention.

FIG. 11 is a schematic cross-sectional view illustrating the structure of a memory cell of an OTP memory according to a seventh embodiment of the present invention. The OTP memory of the seventh embodiment comprises two memory cells, which have the same structures. The two memory cells are respectively located beside a first side and a second side of an isolation wall (not shown). For succinctness, only the structure of one memory cell beside a side of the isolation wall will be described as follows.

In the OTP memory of the seventh embodiment, the memory cell comprises a select transistor $M_{SEL1}$, a following transistor $M_{FL1}$, a following transistor $M_{FL2}$ and an antifuse transistor $M_{AF1}$. The select transistor $M_{SEL1}$, the following transistor $M_{FL1}$, the following transistor $M_{FL2}$ and the antifuse transistor $M_{AF1}$ are forksheet transistors. Each of these transistors comprises two nanowires. The select transistor $M_{SEL1}$, the following transistor $M_{FL1}$, the following transistor $M_{FL2}$ and the antifuse transistor $M_{AF1}$ are formed over the semiconductor substrate sub.

The select transistor $M_{SEL1}$ comprises a drain/source structure 846, a drain/source structure 848, a gate structure and two nanowires 835, 836. The gate structure is located over the semiconductor substrate sub. The gate structure comprises a gate layer 869, two gate dielectric layers 825, 826 and two spacers 867, 868. A first-portion surface of the nanowire 835 is contacted with the isolation wall. A second-portion surface of the nanowire 835 is contacted with the gate structure. A first-portion surface of the nanowire 836 is contacted with the isolation wall. A second-portion surface of the nanowire 836 is contacted with the gate structure. A central region of the nanowire 835 is contacted with the gate dielectric layer 825. A central region of the nanowire 836 is contacted with the gate dielectric layer 826. The gate dielectric layers 825 and 826 are covered by the gate layer 869. The gate layer 869 is located over the semiconductor substrate sub. A first side region of the nanowire 835 is contacted with the spacer 867 and supported by the spacer 867. A second side region of the nanowire 835 is contacted with the spacer 868 and supported by the spacer 868. A first side region of the nanowire 836 is contacted with the spacer 867 and supported by the spacer 867. A second side region of the nanowire 836 is contacted with the spacer 868 and supported by the spacer 868. In addition, the spacers 867 and 868 are formed on the semiconductor substrate sub. The portions of the nanowires 835 and 836 that are contacted with the gate structure are collaboratively served as a nanowire channel region of the select transistor $M_{SEL1}$. The drain/source structures 846 and 848 are formed over the semiconductor substrate sub and respectively located beside two sides of the gate structure. The drain/source structure 846 is electrically contacted with the first terminals of the nanowires 835 and 836. The drain/source structure 848 is electrically contacted with the second terminals of the nanowire 835 and 836.

The following transistor $M_{FL1}$ comprises a drain/source structure 844, the drain/source structure 846, a gate structure and two nanowires 833, 834. The gate structure is located over the semiconductor substrate sub. The gate structure comprises a gate layer 859, two gate dielectric layers 823, 824 and two spacers 857, 858. A first-portion surface of the nanowire 833 is contacted with the isolation wall. A second-portion surface of the nanowire 833 is contacted with the gate structure. A first-portion surface of the nanowire 834 is contacted with the isolation wall. A second-portion surface of the nanowire 834 is contacted with the gate structure. A central region of the nanowire 833 is contacted with the gate dielectric layer 823. A central region of the nanowire 834 is contacted with the gate dielectric layer 824. The gate dielectric layers 823 and 824 are covered by the gate layer 859. The gate layer 859 is located over the semiconductor substrate sub. A first side region of the nanowire 833 is contacted with the spacer 857 and supported by the spacer 857. A second side region of the nanowire 833 is contacted with the spacer 858 and supported by the spacer 858. A first side region of the nanowire 834 is contacted with the spacer 857 and supported by the spacer 857. A second side region of the nanowire 834 is contacted with the spacer 858 and supported by the spacer 858. In addition, the spacers 857 and 858 are formed on the semiconductor substrate sub. The portions of the nanowires 833 and 834 that are contacted with the gate structure are collaboratively served as a nanowire channel region of the following transistor $M_{FL1}$. The drain/source structures 844 and 846 are formed over the semiconductor substrate sub and respectively located beside two sides of the gate structure. The drain/source structure 844 is electrically contacted with the first terminals of the nanowires 833 and 834. The drain/source structure 846 is electrically contacted with the second terminals of the nanowire 833 and 834.

The following transistor $M_{FL2}$ comprises a drain/source structure 842, a drain/source structure 844, a gate structure and two nanowires 831, 832. The gate structure is located over the semiconductor substrate sub. The gate structure comprises a gate layer 829, two gate dielectric layers 821, 822 and two spacers 827, 828. A first-portion surface of the nanowire 831 is contacted with the isolation wall. A second-portion surface of the nanowire 831 is contacted with the gate structure. A first-portion surface of the nanowire 832 is contacted with the isolation wall. A second-portion surface of the nanowire 832 is contacted with the gate structure. A central region of the nanowire 831 is contacted with the gate dielectric layer 821. A central region of the nanowire 832 is contacted with the gate dielectric layer 822. The gate dielectric layers 821 and 822 are covered by the gate layer 829. The gate layer 829 is located over the semiconductor substrate sub. A first side region of the nanowire 831 is contacted with the spacer 827 and supported by the spacer 827. A second side region of the nanowire 831 is contacted with the spacer 828 and supported by the spacer 828. A first side region of the nanowire 832 is contacted with the spacer 827 and supported by the spacer 827. A second side region of the nanowire 832 is contacted with the spacer 828 and supported by the spacer 828. In addition, the spacers 827 and 828 are formed on the semiconductor substrate sub. The portions of the nanowires 831 and 832 that are contacted with the gate structure are collaboratively served as a nanowire channel region of the following transistor $M_{FL2}$. The drain/source structures 842 and 844 are formed over the semiconductor substrate sub and respectively located beside two sides of the gate structure. The drain/source structure 842 is electrically contacted with the first terminals of the nanowires 831 and 832. The drain/source structure 844 is electrically contacted with the second terminals of the nanowire 831 and 832.

The antifuse transistor $M_{AF1}$ comprises a drain/source structure 891, a drain/source structure 842, a gate structure and two nanowires 871, 872. The gate structure is located over the semiconductor substrate sub. The gate structure comprises a gate layer 889, two gate dielectric layers 881, 882 and two spacers 887, 888. A first-portion surface of the nanowire 871 is contacted with the isolation wall. A second-portion surface of the nanowire 871 is contacted with the gate structure. A first-portion surface of the nanowire 872 is contacted with the isolation wall. A second-portion surface of the nanowire 872 is contacted with the gate structure. A central region of the nanowire 871 is contacted with the gate dielectric layer 881. A central region of the nanowire 872 is contacted with the gate dielectric layer 882. The gate dielectric layers 881 and 882 are covered by the gate layer 889. The gate layer 889 is located over the semiconductor substrate sub. A first side region of the nanowire 871 is contacted with the spacer 887 and supported by the spacer 887. A second side region of the nanowire 871 is contacted with the spacer 888 and supported by the spacer 888. A first side region of the nanowire 872 is contacted with the spacer 887 and supported by the spacer 887. A second side region of the nanowire 872 is contacted with the spacer 888 and supported by the spacer 888. In addition, the spacers 887 and 888 are formed on the semiconductor substrate sub. The portions of the nanowires 871 and 872 that are contacted with the gate structure are collaboratively served as a nanowire channel region of the antifuse transistor $M_{AF1}$. The drain/source structures 891 and 842 are formed over the semiconductor substrate sub and respectively located beside two sides of the gate structure. The drain/source structure 891 is electrically contacted with the first terminals of the nanowires 871 and 872. The drain/source structure 842 is electrically contacted with the second terminals of the nanowires 871 and 872.

In this embodiment, the drain/source structure 846 is shared by the select transistor $M_{SEL1}$ and the following transistor $M_{FL1}$, the drain/source structure 844 is shared by the following transistor $M_{FL1}$ and the following transistor $M_{FL2}$, and the drain/source structure 842 is shared by the following transistor $M_{FL2}$ and the antifuse transistor $M_{AF1}$. In an embodiment, the drain/source structures 891, 842, 844, 846 and 848 and the nanowires 831, 832, 833, 834, 835, 836, 871 and 872 have the same dopant type. For example, the drain/source structures 891, 842, 844, 846 and 848 and the nanowires 831, 832, 833, 834, 835, 836, 871 and 872 are n-type doped regions or p-type doped regions.

In the memory cell, the drain/source structure 848 of the select transistor $M_{SEL1}$ is connected with a bit line $BL_1$, the gate layer 869 of the select transistor $M_{SEL1}$ is connected with a word line WL, the gate layer 859 of the following transistor $M_{FL1}$ is connected with a following line $FL_1$, the gate layer 829 of the following transistor $M_{FL2}$ is connected with a following line $FL_2$, and the gate layer 889 of the antifuse transistor $M_{AF1}$ is connected with an antifuse control line AF. In addition, the nanowires 831, 832, 833, 834, 835, 836, 871 and 872 of the memory cell are rectangular nanowires or cylindrical nanowires.

In the memory cell of the OTP memory of the sixth embodiment or the seventh embodiment, each of the four transistors has two nanowires. It is noted that numerous modifications and alterations may be made while retaining the teachings of the invention. For example, in some other embodiments, each transistor has more than one nanowire, and the numbers of the nanowires in four transistors may be identical or different.

In some other embodiments, the forksheet transistor as shown in FIG. 1A or 2A (i.e., the antifuse transistor) and any other appropriate type select transistor (e.g., a fin field-effect transistor) are combined as the memory cell of the OTP memory of the present invention. Similarly, the following transistor may be implemented with the fin field-effect transistor.

For example, the forksheet transistor as shown in FIG. 2A is used as an antifuse transistor, and the fin field-effect transistor is used as a select transistor. The antifuse transistor and the select transistor are collaboratively formed as the memory cell of the OTP memory of the present invention. The first drain/source terminal of the select transistor is connected with a bit line $BL_1$. The gate terminal of the select transistor is connected with a word line WL. The second drain/source terminal of the select transistor is connected with the drain/source structure 242. Moreover, the gate layer 229 of the gate structure is connected with an antifuse control line AF.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An antifuse-type one time programming memory comprising a first memory cell, the first memory cell comprising:
   a semiconductor substrate;
   an isolation wall inserted in the semiconductor substrate;
   a first nanowire, wherein a first-portion surface of the first nanowire is contacted with a first side of the isolation wall;
   a first gate structure contacted with a second-portion surface of the first nanowire, and comprising a first spacer, a second spacer, a first gate dielectric layer and a first gate layer, wherein the first gate layer is electrically connected with an antifuse control line, the first gate dielectric layer is contacted with a central region of the first nanowire, the first gate layer is contacted with the first gate dielectric layer, and the first gate layer is located over the semiconductor substrate, wherein a first terminal of the first nanowire is contacted with the first spacer and supported by the first spacer, a second terminal of the first nanowire is contacted with the second spacer and supported by the second spacer, and the first spacer and the second spacer are formed over the semiconductor substrate;

a first drain/source structure formed over the semiconductor substrate and electrically contacted with the first terminal of the first nanowire;

a second drain/source structure formed over the semiconductor substrate and electrically contacted with the second terminal of the first nanowire, wherein the first nanowire, the first gate structure, the first drain/source structure and the second drain/source structure are collaboratively formed as a first antifuse transistor, and the first antifuse transistor is a forksheet transistor; and a first select transistor, wherein a first drain/source terminal of the first select transistor is electrically connected with the second drain/source structure of the first antifuse transistor, a gate terminal of the first select transistor is electrically connected with a word line, and a second drain/source terminal of the first select transistor is electrically connected with a first bit line.

2. The antifuse-type one time programming memory as claimed in claim 1, wherein the first memory cell further comprises:

a second nanowire, wherein a first-portion surface of the second nanowire is contacted with the first side of the isolation wall, and a first terminal of the second nanowire is electrically contacted with the second drain/source structure;

a second gate structure contacted with a second-portion surface of the second nanowire, and comprising a third spacer, a fourth spacer, a second gate dielectric layer and a second gate layer, wherein the second gate dielectric layer is contacted with a central region of the second nanowire, the second gate layer is contacted with the second gate dielectric layer, the second gate layer is located over the semiconductor substrate, the first terminal of the second nanowire is contacted with the third spacer and supported by the third spacer, a second terminal of the second nanowire is contacted with the fourth spacer and supported by the fourth spacer, and the third spacer and the fourth spacer are formed over the semiconductor substrate; and a third drain/source structure formed over the semiconductor substrate and electrically contacted with the second terminal of the second nanowire, wherein the second nanowire, the second gate structure, the second drain/source structure and the third drain/source structure are collaboratively formed as the first select transistor, wherein the first select transistor is the forksheet transistor, the third drain/source structure is connected with the first bit line, and the second gate layer of the second gate structure is connected with the word line.

3. The antifuse-type one time programming memory as claimed in claim 2, further comprising a second memory cell, wherein the second memory cell further comprises:

a third nanowire, wherein a first-portion surface of the third nanowire is contacted with a second side of the isolation wall;

a third gate structure contacted with a second-portion surface of the third nanowire, and comprising the first spacer, the second spacer, a third gate dielectric layer and the first gate layer, wherein the third gate dielectric layer is contacted with a central region of the third nanowire, the first gate layer is contacted with the third gate dielectric layer, a first terminal of the third nanowire is contacted with the first spacer and supported by the first spacer, and a second terminal of the third nanowire is contacted with the second spacer and supported by the second spacer;

a fourth drain/source structure formed over the semiconductor substrate and electrically contacted with the first terminal of the third nanowire;

a fifth drain/source structure formed over the semiconductor substrate and electrically contacted with the second terminal of the third nanowire, wherein the third nanowire, the third gate structure, the third drain/source structure and the fourth drain/source structure are collaboratively formed as a second antifuse transistor;

a fourth nanowire, wherein a first-portion surface of the fourth nanowire is contacted with the second side of the isolation wall, and a first terminal of the fourth nanowire is electrically contacted with the fifth drain/source structure;

a fourth gate structure contacted with a second-portion surface of the fourth nanowire, and comprising the third spacer, the fourth spacer, a fourth gate dielectric layer and the second gate layer, wherein the fourth gate dielectric layer is contacted with a central region of the fourth nanowire, the second gate layer is contacted with the fourth gate dielectric layer, the first terminal of the fourth nanowire is contacted with the third spacer and supported by the third spacer, and a second terminal of the fourth nanowire is contacted with the fourth spacer and supported by the fourth spacer; and a sixth drain/source structure formed over the semiconductor substrate and electrically contacted with the second terminal of the fourth nanowire, wherein the fourth nanowire, the fourth gate structure, the fifth drain/source structure and the sixth drain/source structure are collaboratively formed as a second select transistor, wherein each of the second select transistor and the second antifuse transistor is the forksheet transistor, and the sixth drain/source structure is connected with a second bit line.

4. The antifuse-type one time programming memory as claimed in claim 2, wherein the second gate dielectric layer is thicker than the first gate dielectric layer.

5. The antifuse-type one time programming memory as claimed in claim 2, wherein a cross section area of the second nanowire is larger than a cross section area of the first nanowire.

6. The antifuse-type one time programming memory as claimed in claim 2, wherein the first memory cell further comprises:

a third nanowire, wherein a first-portion surface of the third nanowire is contacted with the first side of the isolation wall, a first terminal of the third nanowire is electrically contacted with the first drain/source structure, and a second terminal of the third nanowire is electrically contacted with the second drain/source structure, wherein the first gate structure is contacted with a second-portion surface of the third nanowire, wherein the first gate structure further comprises a third gate dielectric layer, the third gate dielectric layer is contacted with a central region of the third nanowire, the first gate layer is contacted with the third gate dielectric layer, the first terminal of the third nanowire is contacted with the first spacer and supported by the first spacer, and the second terminal of the third nanowire is contacted with the second spacer and supported by the second spacer.

7. The antifuse-type one time programming memory as claimed in claim 2, wherein the first memory cell further comprises:

a third nanowire, wherein a first-portion surface of the third nanowire is contacted with the first side of the isolation wall, a first terminal of the third nanowire is electrically contacted with the second drain/source structure, and a second terminal of the third nanowire is electrically contacted with the third drain/source structure, wherein the second gate structure is contacted with a second-portion surface of the third nanowire, wherein the second gate structure further comprises a third gate dielectric layer, the third gate dielectric layer is contacted with a central region of the third nanowire, the second gate layer is contacted with the third gate dielectric layer, the first terminal of the third nanowire is contacted with the third spacer and supported by the third spacer, and the second terminal of the third nanowire is contacted with the fourth spacer and supported by the fourth spacer.

8. The antifuse-type one time programming memory as claimed in claim 2, wherein the first memory cell further comprises:

a third nanowire, wherein a first-portion surface of the third nanowire is contacted with the first side of the isolation wall, a first terminal of the third nanowire is electrically contacted with the first drain/source structure, and a second terminal of the third nanowire is electrically contacted with the second drain/source structure;

a fourth nanowire, wherein a first-portion surface of the fourth nanowire is contacted with the first side of the isolation wall, a first terminal of the fourth nanowire is electrically contacted with the second drain/source structure, and a second terminal of the fourth nanowire is electrically contacted with the third drain/source structure, wherein the first gate structure is contacted with a second-portion surface of the third nanowire, and the second gate structure is contacted with a second-portion surface of the fourth nanowire, wherein the first gate structure further comprises a third gate dielectric layer, the third gate dielectric layer is contacted with a central region of the third nanowire, the first gate layer is contacted with the third gate dielectric layer, the first terminal of the third nanowire is contacted with the first spacer and supported by the first spacer, and the second terminal of the third nanowire is contacted with the second spacer and supported by the second spacer, wherein the second gate structure further comprises a fourth gate dielectric layer, the fourth gate dielectric layer is contacted with a central region of the fourth nanowire, the second gate layer is contacted with the fourth gate dielectric layer, the first terminal of the fourth nanowire is contacted with the third spacer and supported by the third spacer, and the second terminal of the fourth nanowire is contacted with the fourth spacer and supported by the fourth spacer.

9. The antifuse-type one time programming memory as claimed in claim 8, wherein when a program action is performed, the first bit line receives a ground voltage, the word line receives an on voltage, the antifuse control line receives a program voltage, so that one of the first gate dielectric layer and the third gate dielectric layer is ruptured and the first memory cell is programmed to a low-resistance storage state.

10. The antifuse-type one time programming memory as claimed in claim 2, wherein when a read action is performed, the first bit line receives a ground voltage, the word line receives an on voltage, the antifuse control line receives a read voltage, and the first memory cell generates a read current, wherein a storage state of the first memory cell is determined according to the read current.

11. The antifuse-type one time programming memory as claimed in claim 2, wherein the first memory cell further comprises:

a third nanowire, wherein a first-portion surface of the third nanowire is contacted with the first side of the isolation wall, and the first drain/source structure is electrically contacted with a first terminal of the third nanowire;

a third gate structure contacted with a second-portion surface of the third nanowire, and comprising a fifth spacer, a sixth spacer, a third gate dielectric layer and a third gate layer, wherein the third gate dielectric layer is contacted with a central region of the third nanowire, the third gate layer is contacted with the third gate dielectric layer, the third gate layer is located over the semiconductor substrate, the first terminal of the third nanowire is contacted with the fifth spacer and supported by the fifth spacer, a second terminal of the third nanowire is contacted with the sixth spacer and supported by the sixth spacer, and the fifth spacer and the sixth spacer are formed over the semiconductor substrate; and a fourth drain/source structure formed over the semiconductor substrate and electrically contacted with the second terminal of the third nanowire, wherein the third nanowire, the third gate structure, the first drain/source structure and the fourth drain/source structure are collaboratively formed as a second select transistor, wherein the second select transistor is the forksheet transistor, the fourth drain/source structure is connected with the first bit line, and the third gate layer of the third gate structure is connected with the word line.

12. The antifuse-type one time programming memory as claimed in claim 11, wherein the first memory cell further comprises:

a fourth nanowire, wherein a first-portion surface of the fourth nanowire is contacted with the first side of the isolation wall, the first drain/source structure is electrically contacted with a first terminal of the fourth nanowire, and the second drain/source structure is electrically contacted with a second terminal of the fourth nanowire;

a fifth nanowire, wherein a first-portion surface of the fifth nanowire is contacted with the first side of the isolation wall, the second drain/source structure is electrically contacted with a first terminal of the fifth nanowire, and the third drain/source structure is electrically contacted with a second terminal of the fifth nanowire;

a sixth nanowire, wherein a first-portion surface of the sixth nanowire is contacted with the first side of the isolation wall, the first drain/source structure is electrically contacted with a first terminal of the sixth nanowire, and the fourth drain/source structure is electrically contacted with a second terminal of the sixth nanowire, wherein the first gate structure is contacted with a second-portion surface of the fourth nanowire, the second gate structure is contacted with a second-portion surface of the fifth nanowire, and the third gate structure is contacted with a second-portion surface of the sixth nanowire, wherein the first gate structure further comprises a fourth gate dielectric layer, the fourth gate dielectric layer is contacted with a central region of the fourth nanowire, the first gate layer is contacted with the fourth gate dielectric layer, the first terminal of the fourth nanowire is contacted with the first spacer and supported by the first spacer, and the second terminal of the fourth nanowire is contacted with the second spacer and supported by the second spacer, wherein the second gate structure further comprises a fifth gate dielectric layer, the fifth gate dielectric layer is contacted with a central region of the fifth nanowire, the second gate layer is contacted with the fifth gate dielectric layer, the first terminal of the fifth nanowire is contacted with the third spacer and supported by the third spacer, and the second terminal of the fifth nanowire is contacted with the fourth spacer and supported by the fourth spacer, wherein the third gate structure further comprises a sixth gate dielectric layer, the sixth gate dielectric layer is contacted with a central region of the sixth nanowire, the third gate layer is contacted with the sixth gate dielectric layer, the first terminal of the sixth nanowire is contacted with the fifth spacer and supported by the fifth spacer, and the second terminal of the sixth nanowire is contacted with the sixth spacer and supported by the sixth spacer.

13. An antifuse-type one time programming memory comprising a first memory cell, the first memory cell comprising:
   a semiconductor substrate;
   an isolation wall inserted in the semiconductor substrate;
   a first nanowire, wherein a first-portion surface of the first nanowire is contacted with a first side of the isolation wall;
   a first gate structure contacted with a second-portion surface of the first nanowire, and comprising a first spacer, a second spacer, a first gate dielectric layer and a first gate layer, wherein the first gate layer is electrically connected with an antifuse control line, the first gate dielectric layer is contacted with a central region of the first nanowire, the first gate layer is contacted with the first gate dielectric layer, and the first gate layer is located over the semiconductor substrate, wherein a first terminal of the first nanowire is contacted with the first spacer and supported by the first spacer, a second terminal of the first nanowire is contacted with the second spacer and supported by the second spacer, and the first spacer and the second spacer are formed over the semiconductor substrate;
   a first drain/source structure formed over the semiconductor substrate and electrically contacted with the first terminal of the first nanowire;
   a second drain/source structure formed over the semiconductor substrate and electrically contacted with the second terminal of the first nanowire, wherein the first nanowire, the first gate structure, the first drain/source structure and the second drain/source structure are collaboratively formed as a first antifuse transistor, and the first antifuse transistor is a forksheet transistor;
   a first following transistor, wherein a first drain/source terminal of the first following transistor is electrically connected with the second drain/source structure of the first antifuse transistor, and a gate terminal of the first following transistor is electrically connected with a following line; and
   a first select transistor, wherein a first drain/source terminal of the first select transistor is electrically connected with a second drain/source terminal of the first following transistor, a gate terminal of the first select transistor is electrically connected with a word line, and a second drain/source terminal of the first select transistor is electrically connected with a first bit line.

14. The antifuse-type one time programming memory as claimed in claim 13, wherein the first memory cell further comprises:
   a second nanowire, wherein a first-portion surface of the second nanowire is contacted with the first side of the isolation wall, and a first terminal of the second nanowire is electrically contacted with the second drain/source structure;
   a second gate structure contacted with a second-portion surface of the second nanowire, and comprising a third spacer, a fourth spacer, a second gate dielectric layer and a second gate layer, wherein the second gate dielectric layer is contacted with a central region of the second nanowire, the second gate layer is contacted with the second gate dielectric layer, the second gate layer is located over the semiconductor substrate, the first terminal of the second nanowire is contacted with the third spacer and supported by the third spacer, a second terminal of the second nanowire is contacted with the fourth spacer and supported by the fourth spacer, and the third spacer and the fourth spacer are formed over the semiconductor substrate; and
   a third drain/source structure formed over the semiconductor substrate and electrically contacted with the second terminal of the second nanowire, wherein the second nanowire, the second gate structure, the second drain/source structure and the third drain/source structure are collaboratively formed as the first following transistor;
   a third nanowire, wherein a first-portion surface of the third nanowire is contacted with the first side of the isolation wall, and a first terminal of the third nanowire is electrically contacted with the third drain/source structure;
   a third gate structure contacted with a second-portion surface of the third nanowire, and comprising a fifth spacer, a sixth spacer, a third gate dielectric layer and a third gate layer, wherein the third gate dielectric layer is contacted with a central region of the third nanowire, the third gate layer is contacted with the third gate dielectric layer, the third gate layer is located over the semiconductor substrate, the first terminal of the third nanowire is contacted with the fifth spacer and supported by the fifth spacer, a second terminal of the third nanowire is contacted with the sixth spacer and supported by the sixth spacer, and the fifth spacer and the sixth spacer are formed over the semiconductor substrate; and
   a fourth drain/source structure formed over the semiconductor substrate and electrically contacted with the second terminal of the third nanowire, wherein the third nanowire, the third gate structure, the third drain/source structure and the fourth drain/source structure are collaboratively formed as the first select transistor,
   wherein each of the first select transistor and the first following transistor is the forksheet transistor, the fourth drain/source structure is connected with the first bit line, the third gate layer of the third gate structure is connected with the word line, and the second gate layer of the second gate structure is connected with the following line.

15. The antifuse-type one time programming memory as claimed in claim 14, further comprising a second memory cell, wherein the second memory cell further comprises:
    a fourth nanowire, wherein a first-portion surface of the fourth nanowire is contacted with a second side of the isolation wall;
    a fourth gate structure contacted with a second-portion surface of the fourth nanowire, and comprising the first spacer, the second spacer, a fourth gate dielectric layer and the first gate layer, wherein the fourth gate dielectric layer is contacted with a central region of the fourth nanowire, the first gate layer is contacted with the fourth gate dielectric layer, a first terminal of the fourth nanowire is contacted with the first spacer and supported by the first spacer, and a second terminal of the fourth nanowire is contacted with the second spacer and supported by the second spacer;
    a fifth drain/source structure formed over the semiconductor substrate and electrically contacted with the first terminal of the fourth nanowire;
    a sixth drain/source structure formed over the semiconductor substrate and electrically contacted with the second terminal of the fourth nanowire, wherein the fourth nanowire, the fourth gate structure, the fifth drain/source structure and the sixth drain/source structure are collaboratively formed as a second antifuse transistor;
    a fifth nanowire, wherein a first-portion surface of the fifth nanowire is contacted with the second side of the isolation wall, and a first terminal of the fifth nanowire is electrically contacted with the sixth drain/source structure;
    a fifth gate structure contacted with a second-portion surface of the fifth nanowire, and comprising the third spacer, the fourth spacer, a fifth gate dielectric layer and the second gate layer, wherein the fifth gate dielectric layer is contacted with a central region of the fifth nanowire, the second gate layer is contacted with the fifth gate dielectric layer, the first terminal of the fifth nanowire is contacted with the third spacer and supported by the third spacer, and a second terminal of the fifth nanowire is contacted with the fourth spacer and supported by the fourth spacer;
    a seventh drain/source structure formed over the semiconductor substrate and electrically contacted with the second terminal of the fifth nanowire, wherein the fifth nanowire, the fifth gate structure, the sixth drain/source structure and the seventh drain/source structure are collaboratively formed as a second following transistor;
    a sixth nanowire, wherein a first-portion surface of the sixth nanowire is contacted with the second side of the isolation wall, and a first terminal of the sixth nanowire is electrically contacted with the seventh drain/source structure;
    a sixth gate structure contacted with a second-portion surface of the sixth nanowire, and comprising the fifth spacer, the sixth spacer, a sixth gate dielectric layer and the third gate layer, wherein the sixth gate dielectric layer is contacted with a central region of the sixth nanowire, the third gate layer is contacted with the sixth gate dielectric layer, the first terminal of the sixth nanowire is contacted with the fifth spacer and supported by the fifth spacer, and a second terminal of the sixth nanowire is contacted with the sixth spacer and supported by the sixth spacer; and
    an eighth drain/source structure formed over the semiconductor substrate and electrically contacted with the second terminal of the sixth nanowire, wherein the sixth nanowire, the sixth gate structure, the seventh drain/source structure and the eighth drain/source structure are collaboratively formed as a second select transistor,
    wherein each of the second select transistor, the second following transistor and the second antifuse transistor is the forksheet transistor, and the eighth drain/source structure is connected with a second bit line.

16. The antifuse-type one time programming memory as claimed in claim 14, wherein the third gate dielectric layer is thicker than the first gate dielectric layer.

17. The antifuse-type one time programming memory as claimed in claim 14, wherein a cross section area of the third nanowire is larger than a cross section area of the first nanowire.

18. The antifuse-type one time programming memory as claimed in claim 14, wherein the first memory cell further comprises:
    a fourth nanowire, wherein a first-portion surface of the fourth nanowire is contacted with the first side of the isolation wall, a first terminal of the fourth nanowire is electrically contacted with the first drain/source structure, and a second terminal of the fourth nanowire is electrically contacted with the second drain/source structure;
    a fifth nanowire, wherein a first-portion surface of the fifth nanowire is contacted with the first side of the isolation wall, a first terminal of the fifth nanowire is electrically contacted with the second drain/source structure, and a second terminal of the fifth nanowire is electrically contacted with the third drain/source structure;
    a sixth nanowire, wherein a first-portion surface of the sixth nanowire is contacted with the first side of the isolation wall, a first terminal of the sixth nanowire is electrically contacted with the third drain/source structure, and a second terminal of the sixth nanowire is electrically contacted with the fourth drain/source structure;
    wherein the first gate structure is contacted with a second-portion surface of the fourth nanowire, the second gate structure is contacted with a second-portion surface of the fifth nanowire, and the third gate structure is contacted with a second-portion surface of the sixth nanowire,
    wherein the first gate structure further comprises a fourth gate dielectric layer, the fourth gate dielectric layer is contacted with a central region of the fourth nanowire, the first gate layer is contacted with the fourth gate dielectric layer, the first terminal of the fourth nanowire is contacted with the first spacer and supported by the first spacer, and the second terminal of the fourth nanowire is contacted with the second spacer and supported by the second spacer,
    wherein the second gate structure further comprises a fifth gate dielectric layer, the fifth gate dielectric layer is contacted with a central region of the fifth nanowire, the second gate layer is contacted with the fifth gate dielectric layer, the first terminal of the fifth nanowire is contacted with the third spacer and supported by the third spacer, and the second terminal of the fifth nanowire is contacted with the fourth spacer and supported by the fourth spacer, wherein the third gate structure further comprises a sixth gate dielectric layer, the sixth gate dielectric layer is contacted with a central region of the sixth nanowire, the third gate layer is contacted with the sixth gate dielectric layer, the first terminal of the sixth nanowire is contacted with the fifth spacer and supported by the fifth spacer, and the second terminal of the sixth nanowire is contacted with the sixth spacer and supported by the sixth spacer.

19. The antifuse-type one time programming memory as claimed in claim 18, wherein when a program action is performed, the first bit line receives a ground voltage, the word line receives a first on voltage, the following line receives a second on voltage, and the antifuse control line receives a program voltage, so that one of the first gate dielectric layer and the fourth gate dielectric layer is ruptured and the first memory cell is programmed to a low-resistance storage state.

20. The antifuse-type one time programming memory as claimed in claim 14, wherein when a read action is performed, the first bit line receives a ground voltage, the word line receives a first on voltage, the following line receives a second on voltage, the antifuse control line receives a read voltage, and the first memory cell generates a read current, wherein a storage state of the first memory cell is determined according to the read current.

21. The antifuse-type one time programming memory as claimed in claim 14, wherein the first memory cell further comprises:
a fourth nanowire, wherein a first-portion surface of the fourth nanowire is contacted with the first side of the isolation wall, and the first drain/source structure is electrically contacted with a first terminal of the fourth nanowire;
a fourth gate structure contacted with a second-portion surface of the fourth nanowire, and comprising a seventh spacer, an eighth spacer, a fourth gate dielectric layer and a fourth gate layer, wherein the fourth gate dielectric layer is contacted with a central region of the fourth nanowire, the fourth gate layer is contacted with the fourth gate dielectric layer, the fourth gate layer is located over the semiconductor substrate, the first terminal of the fourth nanowire is contacted with the seventh spacer and supported by the seventh spacer, a second terminal of the fourth nanowire is contacted with the eighth spacer and supported by the eighth spacer, and the seventh spacer and the eighth spacer are formed over the semiconductor substrate;
a fifth drain/source structure formed over the semiconductor substrate and electrically contacted with the second terminal of the fourth nanowire, wherein the fourth nanowire, the fourth gate structure, the fourth drain/source structure and the fifth drain/source structure are collaboratively formed as a second following transistor;
a fifth nanowire, wherein a first-portion surface of the fifth nanowire is contacted with the first side of the isolation wall, and the fifth drain/source structure is electrically contacted with a first terminal of the fifth nanowire;
a fifth gate structure contacted with a second-portion surface of the fifth nanowire, and comprising a ninth spacer, a tenth spacer, a fifth gate dielectric layer and a fifth gate layer, wherein the fifth gate dielectric layer is contacted with a central region of the fifth nanowire, the fifth gate layer is contacted with the fifth gate dielectric layer, the fifth gate layer is located over the semiconductor substrate, the first terminal of the fifth nanowire is contacted with the ninth spacer and supported by the ninth spacer, a second terminal of the fifth nanowire is contacted with the tenth spacer and supported by the tenth spacer, and the ninth spacer and the tenth spacer are formed over the semiconductor substrate;
a sixth drain/source structure formed over the semiconductor substrate and electrically contacted with the second terminal of the fifth nanowire, wherein the fifth nanowire, the fifth gate structure, the fifth drain/source structure and the sixth drain/source structure are collaboratively formed as a second select transistor,
wherein each of the second following transistor and the second select transistor is the forksheet transistor, the sixth drain/source structure is connected with the first bit line, the fifth gate layer of the fifth gate structure is connected with the word line, and the fourth gate layer of the fourth gate structure is connected with the following line.

22. The antifuse-type one time programming memory as claimed in claim 21, wherein the first memory cell further comprises:
a sixth nanowire, wherein a first-portion surface of the sixth nanowire is contacted with the first side of the isolation wall, the first drain/source structure is electrically contacted with a first terminal of the sixth nanowire, and the second drain/source structure is electrically contacted with a second terminal of the sixth nanowire;
a seventh nanowire, wherein a first-portion surface of the seventh nanowire is contacted with the first side of the isolation wall, the second drain/source structure is electrically contacted with a first terminal of the seventh nanowire, and the third drain/source structure is electrically contacted with a second terminal of the seventh nanowire;
an eighth nanowire, wherein a first-portion surface of the eighth nanowire is contacted with the first side of the isolation wall, the third drain/source structure is electrically contacted with a first terminal of the eighth nanowire, and the fourth drain/source structure is electrically contacted with a second terminal of the eighth nanowire;
a ninth nanowire, wherein a first-portion surface of the ninth nanowire is contacted with the first side of the isolation wall, the first drain/source structure is electrically contacted with a first terminal of the ninth nanowire, and the fifth drain/source structure is electrically contacted with a second terminal of the ninth nanowire;
a tenth nanowire, wherein a first-portion surface of the tenth nanowire is contacted with the first side of the isolation wall, the first drain/source structure is electrically contacted with a first terminal of the tenth nanowire, and the sixth drain/source structure is electrically contacted with a second terminal of the tenth nanowire;
wherein the first gate structure is contacted with a second-portion surface of the sixth nanowire, the second gate structure is contacted with a second-portion surface of the seventh nanowire, the third gate structure is contacted with a second-portion surface of the eighth nanowire, the fourth gate structure is contacted with a second-portion surface of the ninth nanowire, and the fifth gate structure is contacted with a second-portion surface of the tenth nanowire, wherein the first gate structure further comprises a sixth gate dielectric layer, the sixth gate dielectric layer is contacted with a central region of the sixth nanowire, the first gate layer is contacted with the sixth gate dielectric layer, the first terminal of the sixth nanowire is contacted with the first spacer and supported by the first spacer, and the second terminal of the sixth nanowire is contacted with the second spacer and supported by the second spacer, wherein the second gate structure further comprises a seventh gate dielectric layer, the seventh gate dielectric layer is contacted with a central region of the seventh nanowire, the second gate layer is contacted with the seventh gate dielectric layer, the first terminal of the seventh nanowire is contacted with the third spacer and supported by the third spacer, and the second terminal of the seventh nanowire is contacted with the fourth spacer and supported by the fourth spacer, wherein the third gate structure further comprises an eighth gate dielectric layer, the eighth gate dielectric layer is contacted with a central region of the eighth nanowire, the third gate layer is contacted with the eighth gate dielectric layer, the first terminal of the eighth nanowire is contacted with the fifth spacer and supported by the fifth spacer, and a second terminal of the eighth nanowire is contacted with the sixth spacer and supported by the sixth spacer, wherein the fourth gate structure further comprises a ninth gate dielectric layer, the ninth gate dielectric layer is contacted with a central region of the ninth nanowire, the fourth gate layer is contacted with the ninth gate dielectric layer, the first terminal of the ninth nanowire is contacted with the seventh spacer and supported by the seventh spacer, and the second terminal of the ninth nanowire is contacted with the eighth spacer and supported by the eighth spacer, wherein the fifth gate structure further comprises a tenth gate dielectric layer, the tenth gate dielectric layer is contacted with a central region of the tenth nanowire, the fifth gate layer is contacted with the tenth gate dielectric layer, the first terminal of the tenth nanowire is contacted with the ninth spacer and supported by the ninth spacer, and the second terminal of the tenth nanowire is contacted with the tenth spacer and supported by the tenth spacer.

23. An antifuse-type one time programming memory comprising a first memory cell, the first memory cell comprising:
a semiconductor substrate;
an isolation wall inserted in the semiconductor substrate;
a first nanowire, wherein a first-portion surface of the first nanowire is contacted with a first side of the isolation wall;
a first gate structure contacted with a second-portion surface of the first nanowire, and comprising a first spacer, a second spacer, a first gate dielectric layer and a first gate layer, wherein the first gate layer is electrically connected with an antifuse control line, the first gate dielectric layer is contacted with a central region of the first nanowire, the first gate layer is contacted with the first gate dielectric layer, and the first gate layer is located over the semiconductor substrate, wherein a first terminal of the first nanowire is contacted with the first spacer and supported by the first spacer, a second terminal of the first nanowire is contacted with the second spacer and supported by the second spacer, and the first spacer and the second spacer are formed over the semiconductor substrate;
a first drain/source structure formed over the semiconductor substrate and electrically contacted with the first terminal of the first nanowire;
a second drain/source structure formed over the semiconductor substrate and electrically contacted with the second terminal of the first nanowire, wherein the first nanowire, the first gate structure, the first drain/source structure and the second drain/source structure are collaboratively formed as a first antifuse transistor, and the first antifuse transistor is a forksheet transistor;
a first transistor, wherein a first drain/source terminal of the first transistor is electrically connected with the second drain/source structure of the first antifuse transistor;
a second transistor, wherein a first drain/source terminal of the second transistor is electrically connected with a second drain/source terminal of the first transistor; and
a third transistor, wherein a first drain/source terminal of the third transistor is electrically connected with a second drain/source terminal of the second transistor, a gate terminal of the third transistor is electrically connected with a word line, and a second drain/source terminal of the second third transistor is electrically connected with a first bit line,
wherein a gate terminal of the second transistor is electrically connected with the word line and a gate terminal of the first transistor is electrically connected with a first following line, or the gate terminal of the second transistor is electrically connected with the first following line and the gate terminal of the first transistor is electrically connected with a second following line.

24. The antifuse-type one time programming memory as claimed in claim 23, wherein the first memory cell further comprises:
a second nanowire, wherein a first-portion surface of the second nanowire is contacted with the first side of the isolation wall, and a first terminal of the second nanowire is electrically contacted with the second drain/source structure;
a second gate structure contacted with a second-portion surface of the second nanowire, and comprising a third spacer, a fourth spacer, a second gate dielectric layer and a second gate layer, wherein the second gate dielectric layer is contacted with a central region of the second nanowire, the second gate layer is contacted with the second gate dielectric layer, the second gate layer is located over the semiconductor substrate, the first terminal of the second nanowire is contacted with the third spacer and supported by the third spacer, a second terminal of the second nanowire is contacted with the fourth spacer and supported by the fourth spacer, and the third spacer and the fourth spacer are formed over the semiconductor substrate; and
a third drain/source structure formed over the semiconductor substrate and electrically contacted with the second terminal of the second nanowire, wherein the second nanowire, the second gate structure, the second drain/source structure and the third drain/source structure are collaboratively formed as the first transistor;
a third nanowire, wherein a first-portion surface of the third nanowire is contacted with the first side of the isolation wall, and a first terminal of the third nanowire is electrically contacted with the third drain/source structure;

a third gate structure contacted with a second-portion surface of the third nanowire, and comprising a fifth spacer, a sixth spacer, a third gate dielectric layer and a third gate layer, wherein the third gate dielectric layer is contacted with a central region of the third nanowire, the third gate layer is contacted with the third gate dielectric layer, the third gate layer is located over the semiconductor substrate, the first terminal of the third nanowire is contacted with the fifth spacer and supported by the fifth spacer, a second terminal of the third nanowire is contacted with the sixth spacer and supported by the sixth spacer, and the fifth spacer and the sixth spacer are formed over the semiconductor substrate;

a fourth drain/source structure formed over the semiconductor substrate and electrically contacted with the second terminal of the third nanowire, wherein the third nanowire, the third gate structure, the third drain/source structure and the fourth drain/source structure are collaboratively formed as the second transistor;

a fourth nanowire, wherein a first-portion surface of the fourth nanowire is contacted with the first side of the isolation wall, and a first terminal of the fourth nanowire is electrically contacted with the fourth drain/source structure;

a fourth gate structure contacted with a second-portion surface of the fourth nanowire, and comprising a seventh spacer, an eighth spacer, a fourth gate dielectric layer and a fourth gate layer, wherein the fourth gate dielectric layer is contacted with a central region of the fourth nanowire, the fourth gate layer is contacted with the fourth gate dielectric layer, the fourth gate layer is located over the semiconductor substrate, the first terminal of the fourth nanowire is contacted with the seventh spacer and supported by the seventh spacer, a second terminal of the fourth nanowire is contacted with the eighth spacer and supported by the eighth spacer, and the seventh spacer and the eighth spacer are formed over the semiconductor substrate; and a fifth drain/source structure formed over the semiconductor substrate and electrically contacted with the second terminal of the fourth nanowire, wherein the fourth nanowire, the fourth gate structure, the fourth drain/source structure and the fifth drain/source structure are collaboratively formed as the third transistor, wherein each of the first transistor, the second transistor and the third transistor is a forksheet transistor.

25. The antifuse-type one time programming memory as claimed in claim 24, further comprising a second memory cell, wherein the second memory cell further comprises:

a fifth nanowire, wherein a first-portion surface of the fifth nanowire is contacted with a second side of the isolation wall;

a fifth gate structure contacted with a second-portion surface of the fifth nanowire, and comprising the first spacer, the second spacer, a fifth gate dielectric layer and the first gate layer, wherein the fifth gate dielectric layer is contacted with a central region of the fifth nanowire, the first gate layer is contacted with the fifth gate dielectric layer, a first terminal of the fifth nanowire is contacted with the first spacer and supported by the first spacer, and a second terminal of the fifth nanowire is contacted with the second spacer and supported by the second spacer;

a sixth drain/source structure formed over the semiconductor substrate and electrically contacted with the first terminal of the fifth nanowire;

a seventh drain/source structure formed over the semiconductor substrate and electrically contacted with the second terminal of the fifth nanowire, wherein the fifth nanowire, the fifth gate structure, the sixth drain/source structure and the seventh drain/source structure are collaboratively formed as a second antifuse transistor;

a sixth nanowire, wherein a first-portion surface of the sixth nanowire is contacted with the second side of the isolation wall, and a first terminal of the sixth nanowire is electrically contacted with the seventh drain/source structure;

a sixth gate structure contacted with a second-portion surface of the sixth nanowire, and comprising the third spacer, the fourth spacer, a sixth gate dielectric layer and the second gate layer, wherein the sixth gate dielectric layer is contacted with a central region of the sixth nanowire, the second gate layer is contacted with the sixth gate dielectric layer, the first terminal of the sixth nanowire is contacted with the third spacer and supported by the third spacer, and a second terminal of the sixth nanowire is contacted with the fourth spacer and supported by the fourth spacer;

an eighth drain/source structure formed over the semiconductor substrate and electrically contacted with the second terminal of the sixth nanowire, wherein the sixth nanowire, the sixth gate structure, the seventh drain/source structure and the eighth drain/source structure are collaboratively formed as a fourth transistor;

a seventh nanowire, wherein a first-portion surface of the seventh nanowire is contacted with the second side of the isolation wall, and a first terminal of the seventh nanowire is electrically contacted with the eighth drain/source structure;

a seventh gate structure contacted with a second-portion surface of the seventh nanowire, and comprising the fifth spacer, the sixth spacer, a seventh gate dielectric layer and the third gate layer, wherein the seventh gate dielectric layer is contacted with a central region of the seventh nanowire, the third gate layer is contacted with the seventh gate dielectric layer, the first terminal of the seventh nanowire is contacted with the fifth spacer and supported by the fifth spacer, and a second terminal of the seventh nanowire is contacted with the sixth spacer and supported by the sixth spacer;

a ninth drain/source structure formed over the semiconductor substrate and electrically contacted with the second terminal of the seventh nanowire, wherein the seventh nanowire, the seventh gate structure, the eighth drain/source structure and the ninth drain/source structure are collaboratively formed as a fifth transistor;

an eighth nanowire, wherein a first-portion surface of the eighth nanowire is contacted with the second side of the isolation wall, and a first terminal of the eighth nanowire is electrically contacted with the ninth drain/source structure;

an eighth gate structure contacted with a second-portion surface of the eighth nanowire, and comprising the seventh spacer, the eighth spacer, an eighth gate dielectric layer and the fourth gate layer, wherein the eighth gate dielectric layer is contacted with a central region of the eighth nanowire, the fourth gate layer is contacted with the seventh gate dielectric layer, the first terminal of the eighth nanowire is contacted with the seventh spacer and supported by the seventh spacer, and a second terminal of the eighth nanowire is contacted with the eighth spacer and supported by the eighth spacer;

a tenth drain/source structure formed over the semiconductor substrate and electrically contacted with the second terminal of the eighth nanowire, wherein the tenth drain/source structure is electrically connected with a second bit line, and the eighth nanowire, the eighth gate structure, the ninth drain/source structure and the tenth drain/source structure are collaboratively formed as a sixth transistor;

wherein each of the fourth transistor, the fifth transistor, the sixth transistor and the second antifuse transistor is the forksheet transistor.

26. The antifuse-type one time programming memory as claimed in claim 24, wherein the first memory cell further comprises:

a fifth nanowire, wherein a first-portion surface of the fifth nanowire is contacted with the first side of the isolation wall, a first terminal of the fifth nanowire is electrically contacted with the first drain/source structure, and a second terminal of the fifth nanowire is electrically contacted with the second drain/source structure;

a sixth nanowire, wherein a first-portion surface of the sixth nanowire is contacted with the first side of the isolation wall, a first terminal of the sixth nanowire is electrically contacted with the second drain/source structure, and a second terminal of the sixth nanowire is electrically contacted with the third drain/source structure;

a seventh nanowire, wherein a first-portion surface of the seventh nanowire is contacted with the first side of the isolation wall, a first terminal of the seventh nanowire is electrically contacted with the third drain/source structure, and a second terminal of the seventh nanowire is electrically contacted with the fourth drain/source structure;

an eighth nanowire, wherein a first-portion surface of the eighth nanowire is contacted with the first side of the isolation wall, a first terminal of the eighth nanowire is electrically contacted with the fourth drain/source structure, and a second terminal of the eighth nanowire is electrically contacted with the fifth drain/source structure, wherein the first gate structure is contacted with a second-portion surface of the fifth nanowire, the second gate structure is contacted with a second-portion surface of the sixth nanowire, the third gate structure is contacted with a second-portion surface of the seventh nanowire, and the fourth gate structure is contacted with a second-portion surface of the eighth nanowire;

wherein the first gate structure further comprises a fifth gate dielectric layer, the fifth gate dielectric layer is contacted with a central region of the fifth nanowire, the first gate layer is contacted with the fifth gate dielectric layer, the first terminal of the fifth nanowire is contacted with the first spacer and supported by the first spacer, and the second terminal of the fifth nanowire is contacted with the second spacer and supported by the second spacer;

wherein the second gate structure further comprises a sixth gate dielectric layer, the sixth gate dielectric layer is contacted with a central region of the sixth nanowire, the second gate layer is contacted with the sixth gate dielectric layer, the first terminal of the sixth nanowire is contacted with the third spacer and supported by the third spacer, and the second terminal of the sixth nanowire is contacted with the fourth spacer and supported by the fourth spacer, wherein the third gate structure further comprises a seventh gate dielectric layer, the seventh gate dielectric layer is contacted with a central region of the seventh nanowire, the third gate layer is contacted with the seventh gate dielectric layer, the first terminal of the seventh nanowire is contacted with the fifth spacer and supported by the fifth spacer, and the second terminal of the seventh nanowire is contacted with the sixth spacer and supported by the sixth spacer, wherein the fourth gate structure further comprises a eighth gate dielectric layer, the eighth gate dielectric layer is contacted with a central region of the eighth nanowire, the fourth gate layer is contacted with the eighth gate dielectric layer, the first terminal of the eighth nanowire is contacted with the seventh spacer and supported by the seventh spacer, and the second terminal of the eighth nanowire is contacted with the eighth spacer and supported by the eighth spacer.

27. The antifuse-type one time programming memory as claimed in claim 26, wherein the third transistor is a first select transistor, the second transistor is a second select transistor, and the first transistor is a first following transistor, the fifth drain/source structure is connected with the first bit line, the fourth gate layer of the fourth gate structure is connected with the word line, the third gate layer of the third gate structure is connected with the word line, and the second gate layer of the second gate structure is connected with the first following line.

28. The antifuse-type one time programming memory as claimed in claim 26, wherein the third transistor is a first select transistor, the second transistor is a first following transistor, and the first transistor is a second following transistor, the fifth drain/source structure is connected with the first bit line, the fourth gate layer of the fourth gate structure is connected with the word line, the third gate layer of the third gate structure is connected with the first following line, and the second gate layer of the second gate structure is connected with the second following line.

* * * * *